US012568683B2

(12) United States Patent
Frougier et al.

(10) Patent No.: US 12,568,683 B2
(45) Date of Patent: Mar. 3, 2026

(54) SINGLE STACK DUAL CHANNEL GATE-ALL-AROUND NANOSHEET WITH STRAINED PFET AND BOTTOM DIELECTRIC ISOLATION NFET

(71) Applicant: International Business Machines Corporation, Armonk, NY (US)

(72) Inventors: Julien Frougier, Albany, NY (US); Andrew M. Greene, Slingerlands, NY (US); Shogo Mochizuki, Mechanicville, NY (US); Kangguo Cheng, Schenectady, NY (US); Ruilong Xie, Niskayuna, NY (US); Heng Wu, Santa Clara, CA (US); Min Gyu Sung, Latham, NY (US); Liqiao Qin, Albany, NY (US); Gen Tsutsui, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 740 days.

(21) Appl. No.: 17/808,360

(22) Filed: Jun. 23, 2022

(65) Prior Publication Data

US 2023/0420457 A1      Dec. 28, 2023

(51) Int. Cl.
*H10D 84/85* (2025.01)
*H10D 30/00* (2025.01)
(Continued)

(52) U.S. Cl.
CPC ....... *H10D 84/856* (2025.01); *H10D 30/6735* (2025.01); *H10D 30/6757* (2025.01); *H10D 62/118* (2025.01); *H10D 62/832* (2025.01); *H10D 84/0167* (2025.01); *H10D 84/038* (2025.01); *H10D 84/85* (2025.01); *H10D*

30/43 (2025.01); *H10D 30/501* (2025.01); *H10D 30/502* (2025.01); *H10D 30/504* (2025.01);
(Continued)

(58) Field of Classification Search
CPC ............. H10D 84/856; H10D 84/0167; H10D 84/038; H10D 84/85; H10D 84/0126; H10D 84/832; H10D 84/851; H10D 30/6735; H10D 30/6757; H10D 30/43; H10D 30/501; H10D 30/502; H10D 30/504; H10D 30/507; H10D 62/118; H10D 62/832
See application file for complete search history.

(56) References Cited

U.S. PATENT DOCUMENTS 9,997,519 B1      6/2018  Bao et al.
10,263,100 B1 *   4/2019  Bi ........................ H10D 62/364
(Continued)

OTHER PUBLICATIONS

Mochizuki, "Stacked Gate-All-Around Nanosheet pFET with Highly Compressive Strained Si1-xGex Channel", IEEE, Mar. 11, 2021, 4p.

*Primary Examiner* — Sue A Purvis
*Assistant Examiner* — Heim Kirin Grewal
(74) *Attorney, Agent, or Firm* — Cantor Colburn LLP; Samuel Waldbaum

(57)      ABSTRACT

Embodiments of the invention include a single stack dual channel gate-all-around nanosheet with strained PFET and bottom dielectric isolation NFET. A PFET comprising at least one silicon germanium channel is formed. An NFET comprising at least one silicon channel is formed, the PFET being positioned laterally to the NFET, the at least one silicon channel and the at least one silicon germanium channel being staggered in a vertical direction.

17 Claims, 36 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 62/832* | (2025.01) |
| *H10D 84/01* | (2025.01) |
| *H10D 84/03* | (2025.01) |
| *H10D 84/83* | (2025.01) |

(52) U.S. Cl.
CPC ....... *H10D 30/507* (2025.01); *H10D 84/0126* (2025.01); *H10D 84/832* (2025.01); *H10D 84/851* (2025.01)

(56) References Cited

U.S. PATENT DOCUMENTS

| | | | |
|---|---|---|---|
| 10,553,678 B2 | 2/2020 | Lee et al. | |
| 10,615,083 B2 | 4/2020 | Bao et al. | |
| 10,672,742 B2 | 6/2020 | Wu et al. | |
| 10,741,641 B2 | 8/2020 | Guillorn et al. | |
| 11,037,835 B2 | 6/2021 | Chen et al. | |
| 11,282,961 B2 | 3/2022 | Frougier et al. | |
| 2017/0040321 A1 | 2/2017 | Mitard et al. | |
| 2019/0355723 A1* | 11/2019 | Miao .................... | H10D 62/121 |
| 2020/0144133 A1 | 5/2020 | Wang et al. | |
| 2020/0365467 A1* | 11/2020 | Cheng ................ | H10D 84/0193 |
| 2021/0343858 A1 | 11/2021 | Wang et al. | |
| 2021/0358911 A1 | 11/2021 | Zhang et al. | |
| 2022/0310602 A1* | 9/2022 | Greene ................ | H10D 62/115 |
| 2023/0031490 A1* | 2/2023 | Shih .................... | H10D 30/014 |

* cited by examiner

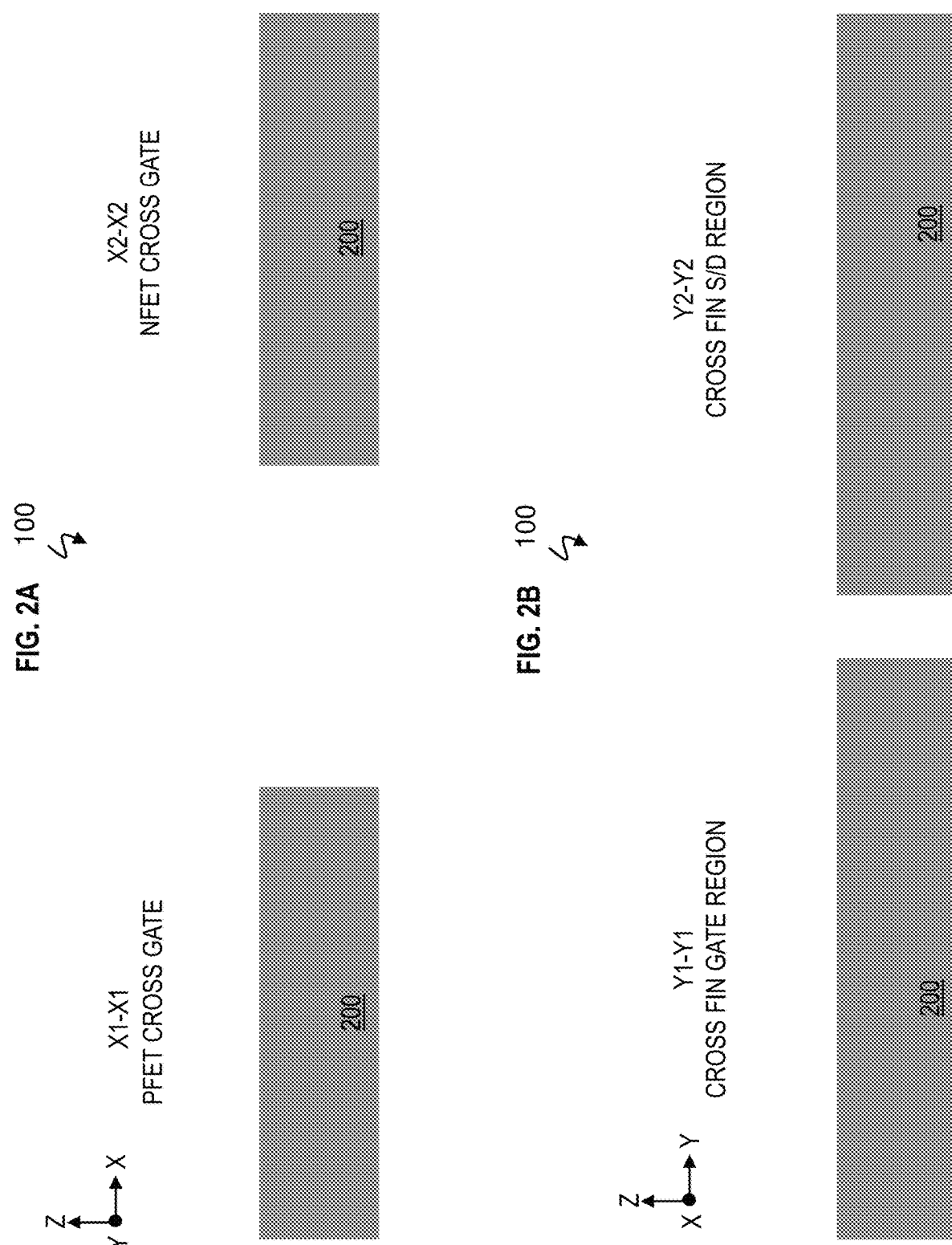

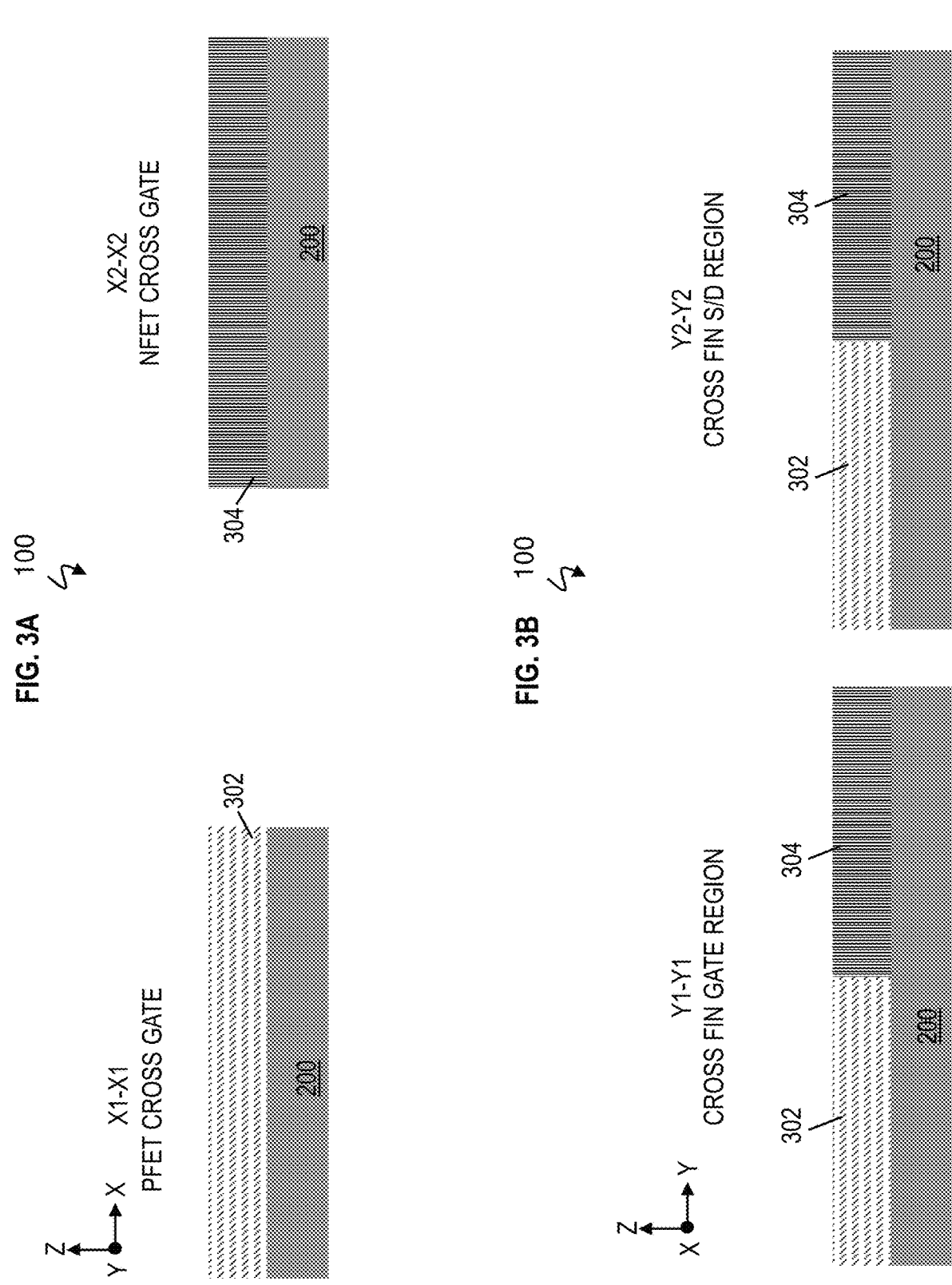
FIG. 3A    100
X1-X1
PFET CROSS GATE
302
200
X2-X2
NFET CROSS GATE
304
200
FIG. 3B    100
Y1-Y1
CROSS FIN GATE REGION
302
304
200
Y2-Y2
CROSS FIN S/D REGION
302
304
200

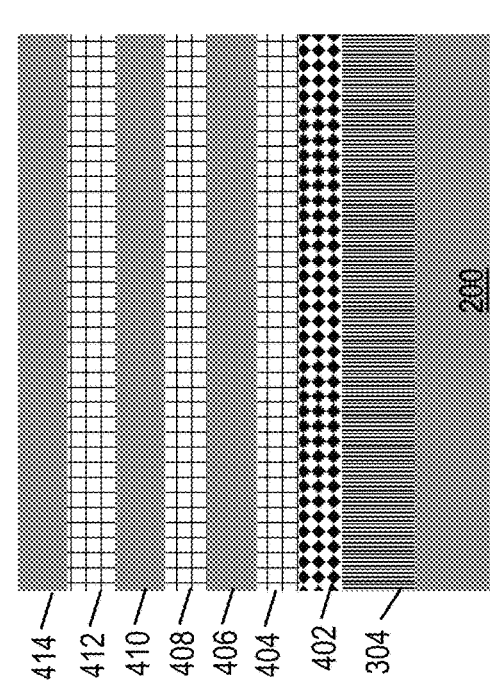
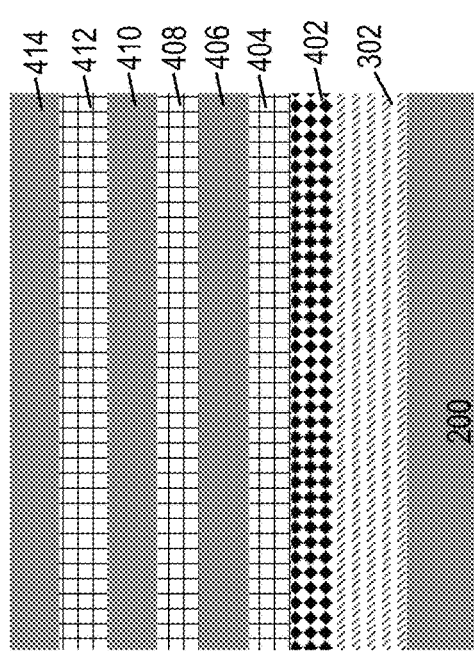
FIG. 4A  100
X2-X2
NFET CROSS GATE
X1-X1
PFET CROSS GATE

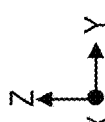
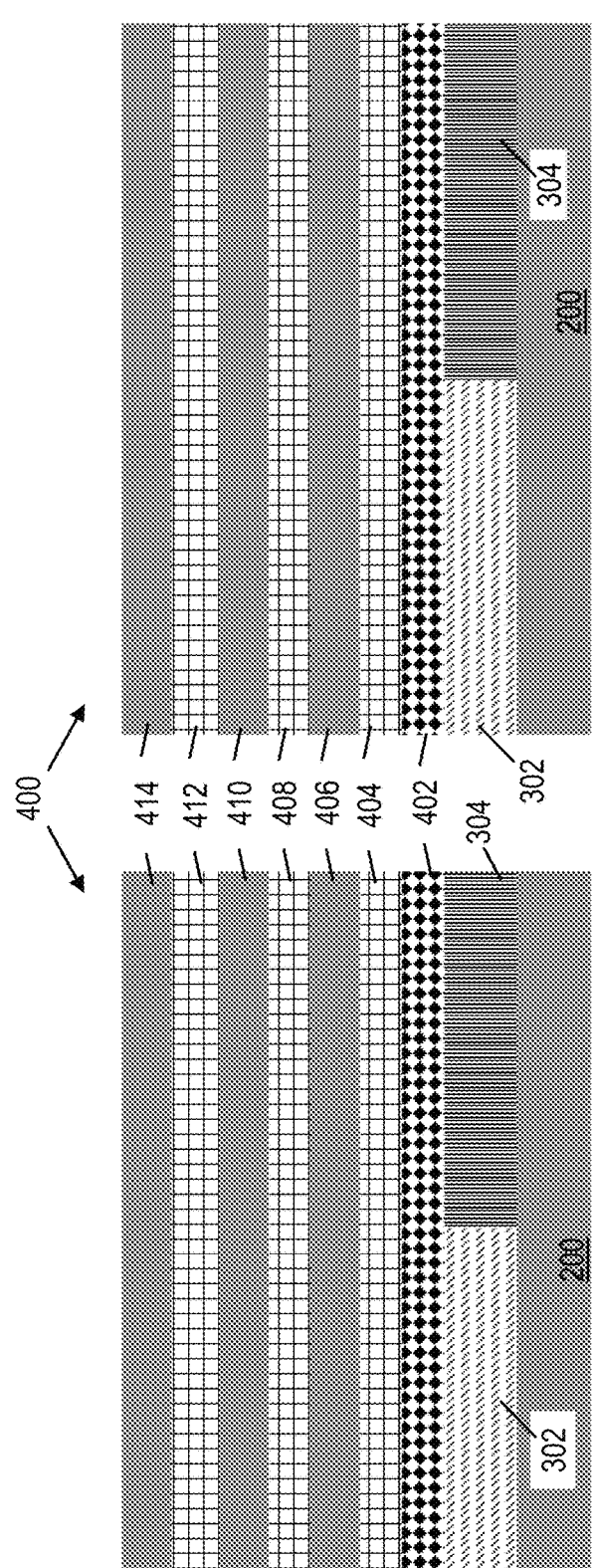
FIG. 4B

FIG. 5A
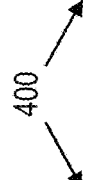
100
X2-X2
NFET CROSS GATE
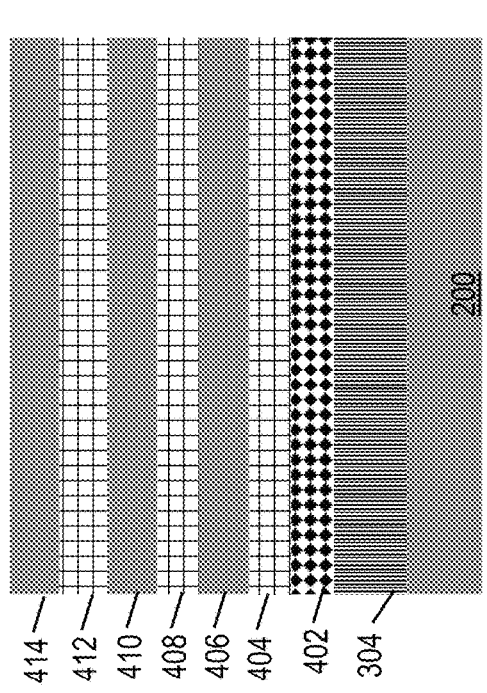
414
412
410
408
406
404
402
304
200
400
X1-X1
PFET CROSS GATE
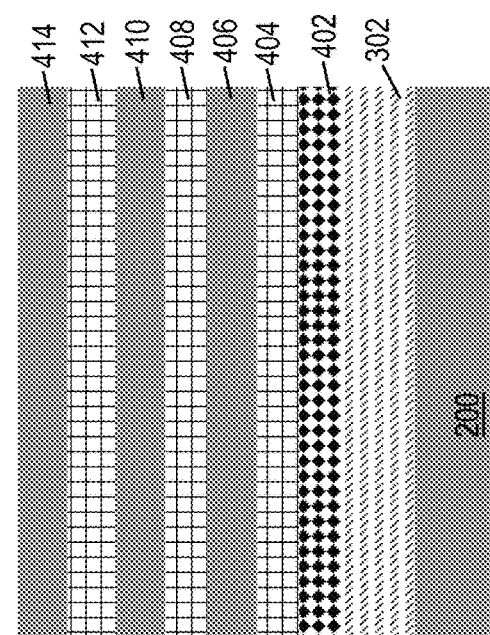
414
412
410
408
406
404
402
302
200
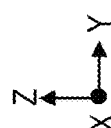
Z
X Y

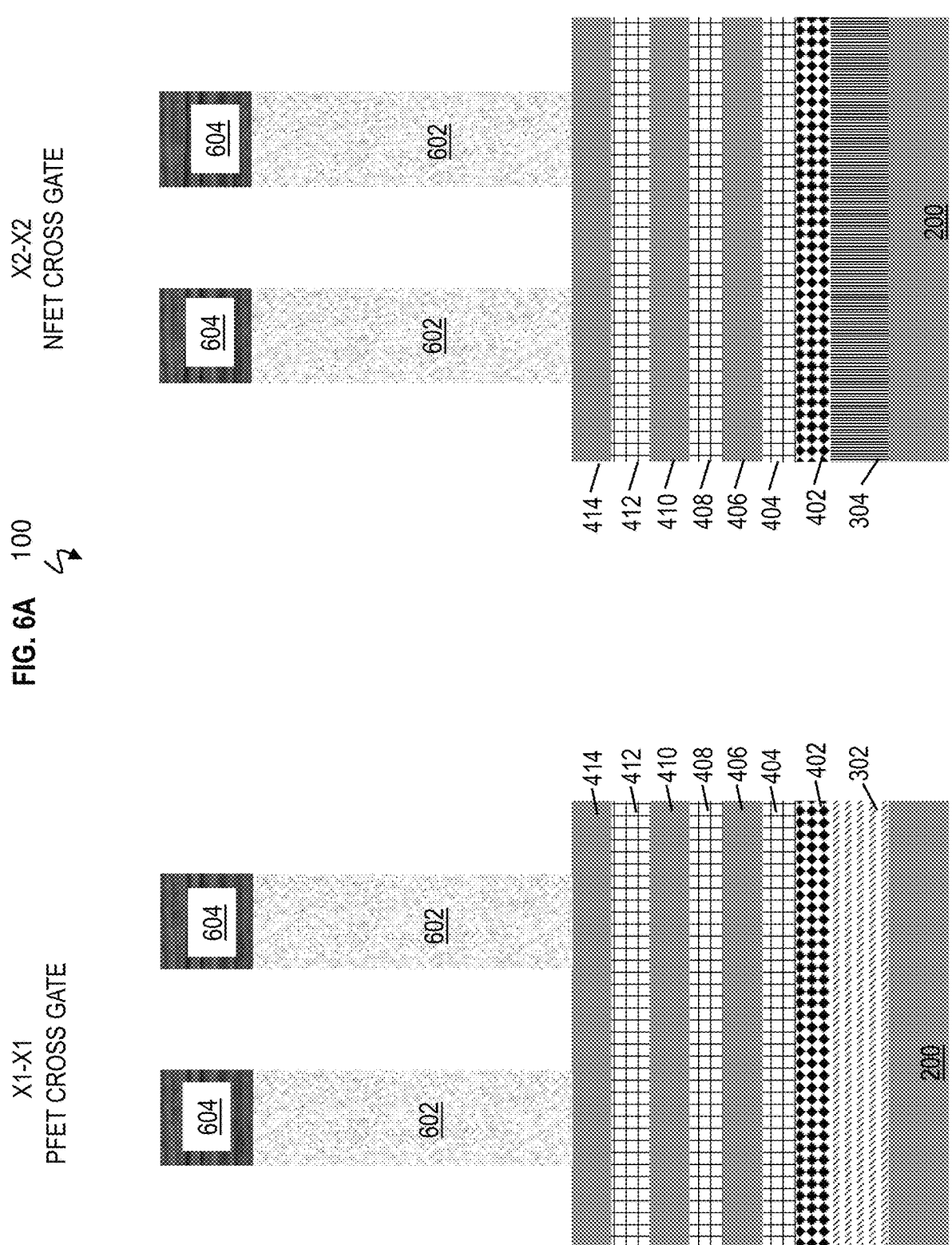
FIG. 6A     100

FIG. 7A   100
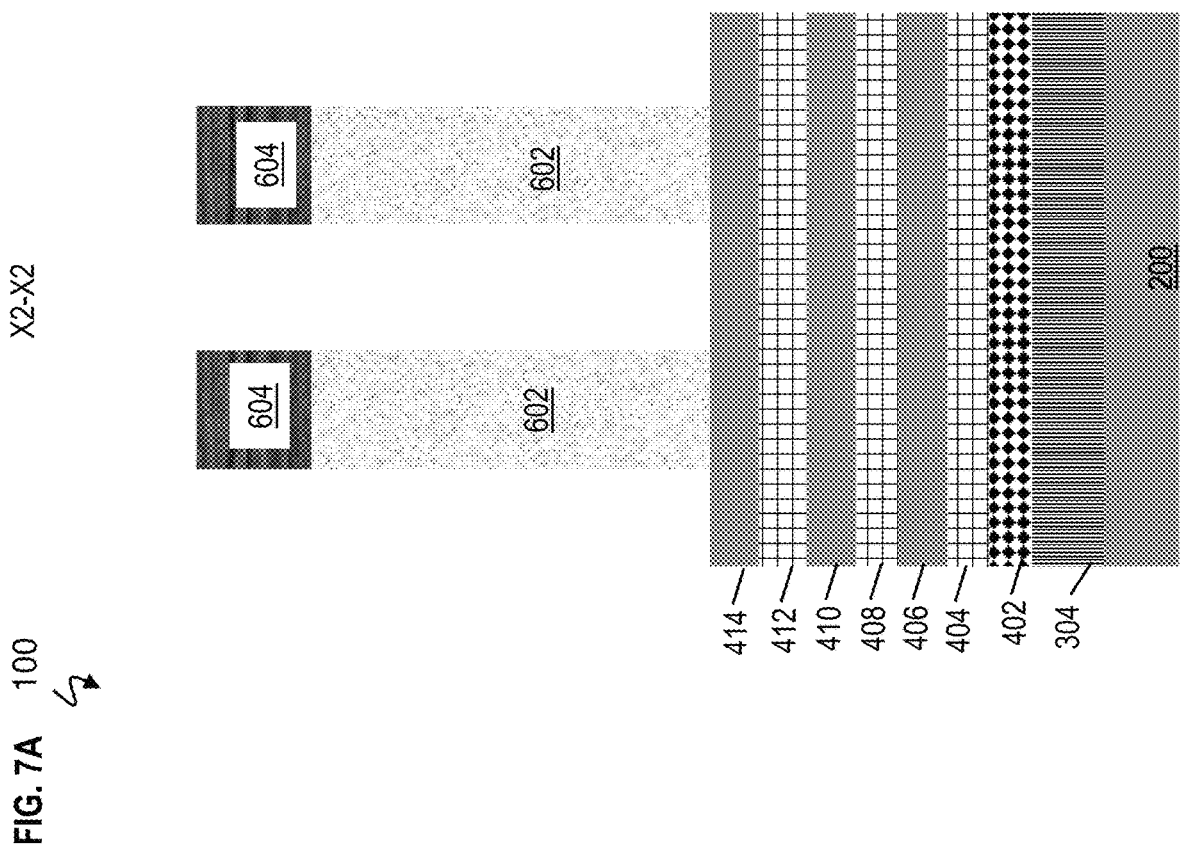
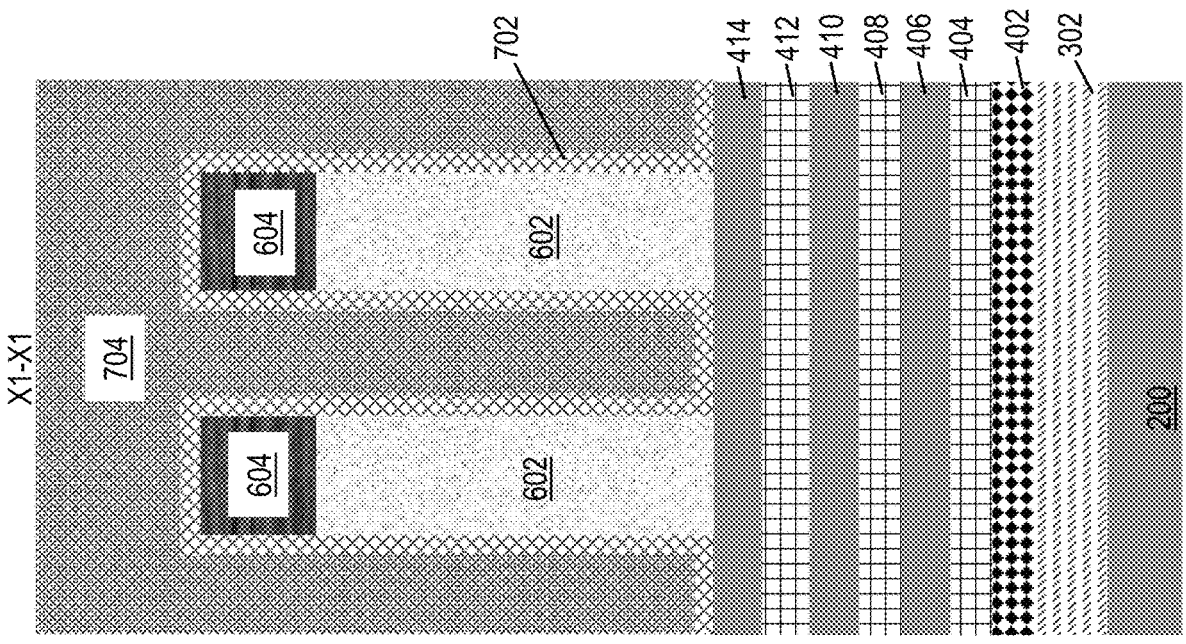

FIG. 8A   100
X2-X2
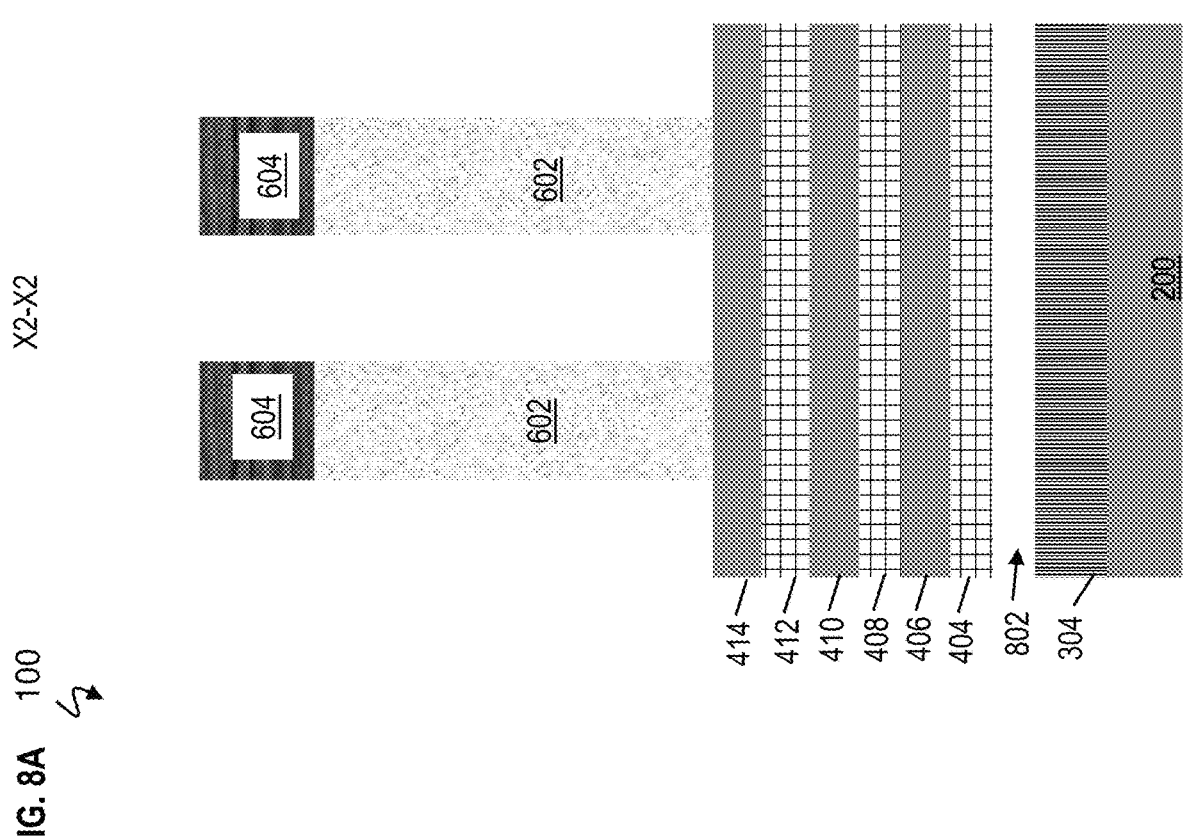
X1-X1
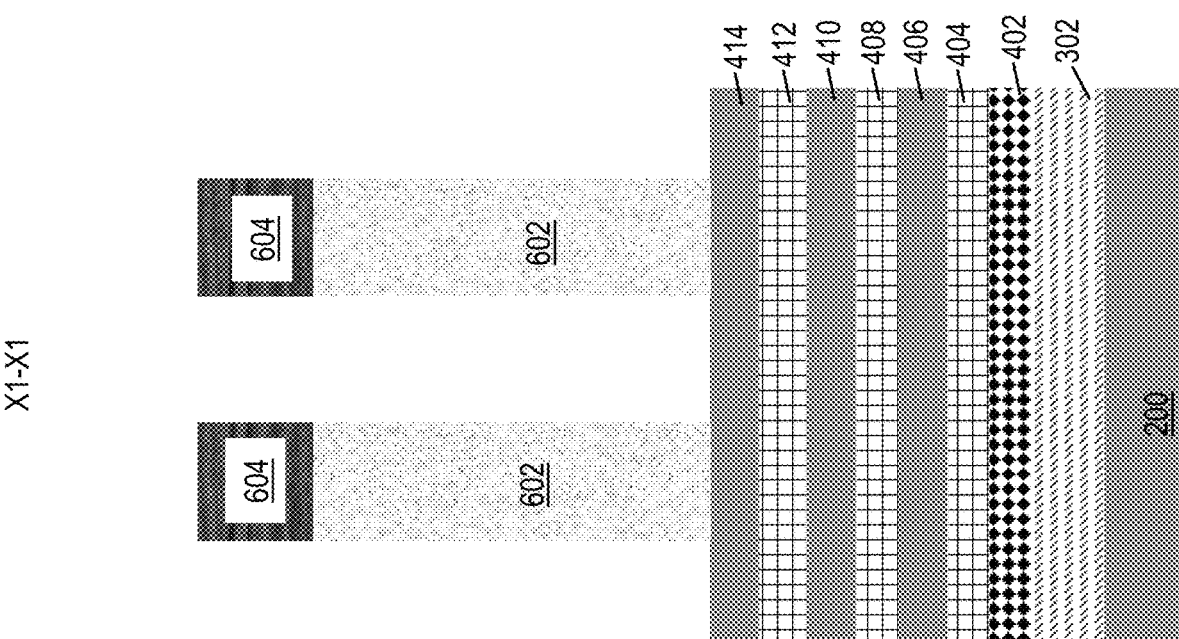

Figures 20, 21:
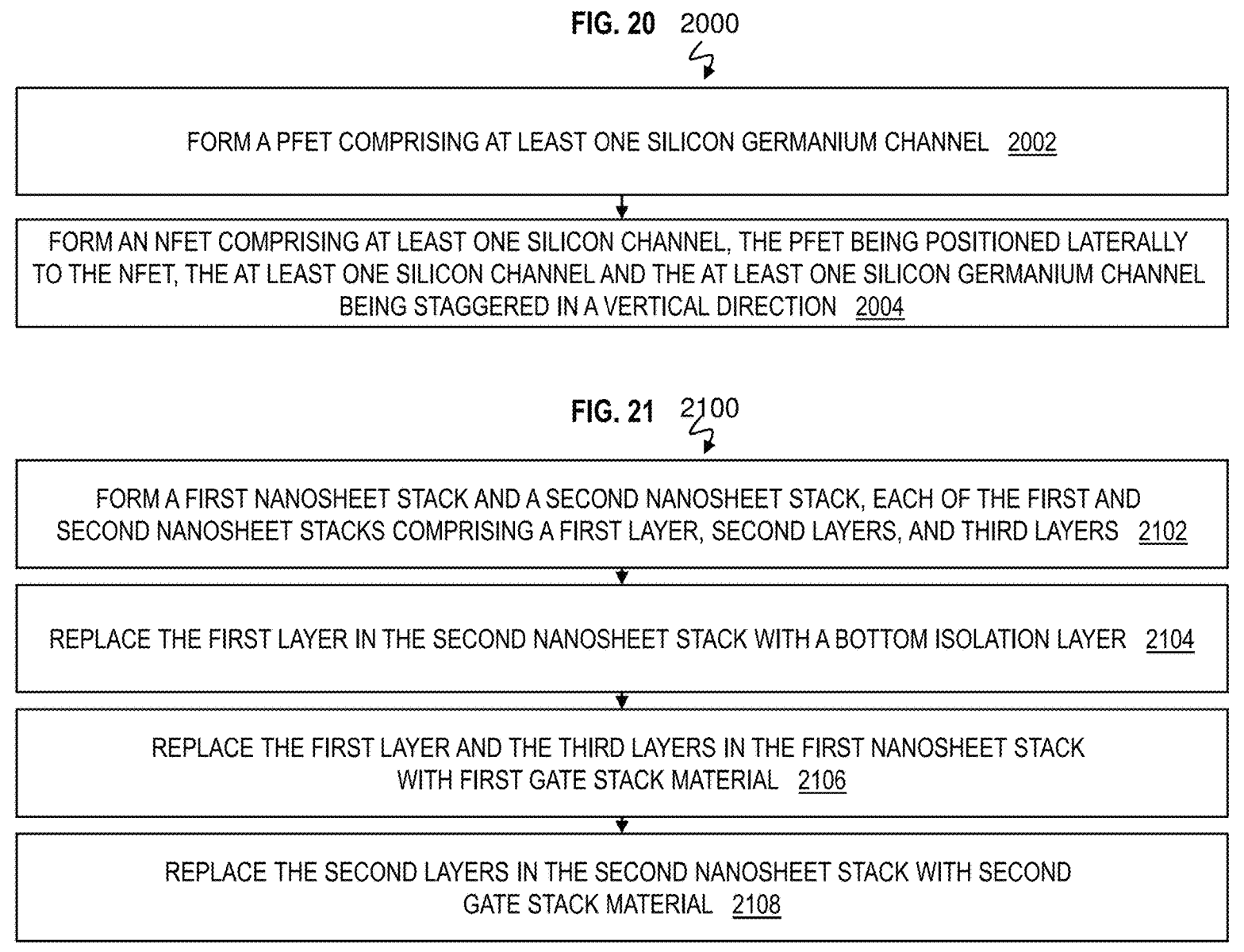

FIG. 20 2000

FORM A PFET COMPRISING AT LEAST ONE SILICON GERMANIUM CHANNEL  2002

FORM AN NFET COMPRISING AT LEAST ONE SILICON CHANNEL, THE PFET BEING POSITIONED LATERALLY TO THE NFET, THE AT LEAST ONE SILICON CHANNEL AND THE AT LEAST ONE SILICON GERMANIUM CHANNEL BEING STAGGERED IN A VERTICAL DIRECTION  2004

FIG. 21 2100

FORM A FIRST NANOSHEET STACK AND A SECOND NANOSHEET STACK, EACH OF THE FIRST AND SECOND NANOSHEET STACKS COMPRISING A FIRST LAYER, SECOND LAYERS, AND THIRD LAYERS  2102

REPLACE THE FIRST LAYER IN THE SECOND NANOSHEET STACK WITH A BOTTOM ISOLATION LAYER  2104

REPLACE THE FIRST LAYER AND THE THIRD LAYERS IN THE FIRST NANOSHEET STACK WITH FIRST GATE STACK MATERIAL  2106

REPLACE THE SECOND LAYERS IN THE SECOND NANOSHEET STACK WITH SECOND GATE STACK MATERIAL  2108

SINGLE STACK DUAL CHANNEL GATE-ALL-AROUND NANOSHEET WITH STRAINED PFET AND BOTTOM DIELECTRIC ISOLATION NFET

BACKGROUND

The present invention generally relates to fabrication methods and resulting structures for integrated circuits, and more specifically, to fabrication methods and resulting structures configured and arranged to implement single stack dual channel gate-all-around nanosheet with strained P-type field-effect transistor (PFET) and bottom dielectric isolation N-type field-effect transistor (NFET).

A metal-oxide-semiconductor field-effect transistor (MOSFET) is a transistor used for amplifying or switching electronic signals. The MOSFET has a source, a drain, and a metal oxide gate electrode. A conventional FET is a planar device where the entire channel region of the device is formed parallel and slightly below the planar upper surface of the semiconducting substrate. In contrast to a planar FET, there are so-called three-dimensional (3D) devices, such as a FinFET device, which is a three-dimensional structure. One type of device that shows promise for advanced integrated circuit products is generally known as a nanosheet transistor. In general, a nanosheet transistor has a fin-type channel structure that includes of a plurality of vertically spaced-apart sheets of semiconductor material. A gate structure for the device is positioned around each of these spaced-apart layers of channel semiconductor material.

SUMMARY

Embodiments of the present invention are directed to single stack dual channel gate-all-around nanosheet with a strained PFET and bottom dielectric isolation NFET. A non-limiting device includes a PFET comprising at least one silicon germanium channel and an NFET comprising at least one silicon channel. The NFET device is positioned laterally to the NFET device. The at least one silicon channel and the at least one silicon germanium channel are staggered in a vertical direction.

Embodiments of the present invention are directed to a method that includes forming a stack into a first nanosheet stack and a second nanosheet stack, each of the first and second nanosheet stacks comprising a first layer, second layers, and third layers. The method includes replacing the first layer in the second nanosheet stack with an electrically insulating bottom isolation layer and replacing the first layer and the third layers in the first nanosheet stack with first gate stack material. The method includes replacing the second layers in the second nanosheet stack with second gate stack material.

Other embodiments of the present invention implement features of the above-described devices/structures in methods.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 2A and 2B depict cross-sectional views of a portion of an IC under-fabrication after fabrication operations according to one or more embodiments of the invention;

FIGS. 3A and 3B depict cross-sectional views of a portion of an IC under-fabrication after fabrication operations according to one or more embodiments of the invention;

FIGS. 4A and 4B depict cross-sectional views of a portion of an IC under-fabrication after fabrication operations according to one or more embodiments of the invention;

FIGS. 5A and 5B depict cross-sectional views of a portion of an IC under-fabrication after fabrication operations according to one or more embodiments of the invention;

FIGS. 6A and 6B depict cross-sectional views of a portion of an IC under-fabrication after fabrication operations according to one or more embodiments of the invention;

FIGS. 7A and 7B depict cross-sectional views of a portion of an IC under-fabrication after fabrication operations according to one or more embodiments of the invention;

FIGS. 8A and 8B depict cross-sectional views of a portion of an IC under-fabrication after fabrication operations according to one or more embodiments of the invention;

FIG. 20 is a flowchart of a computer-implemented method of forming a single stack dual channel gate-all-around nanosheet with a strained PFET and a bottom dielectric isolation NFET according to one or more embodiments of the invention; and FIG. 21 is a flowchart of a computer-implemented method of forming a single stack dual channel gate-all-around nanosheet with a strained PFET and a bottom dielectric isolation NFET according to one or more embodiments.

DETAILED DESCRIPTION

Figure 1:
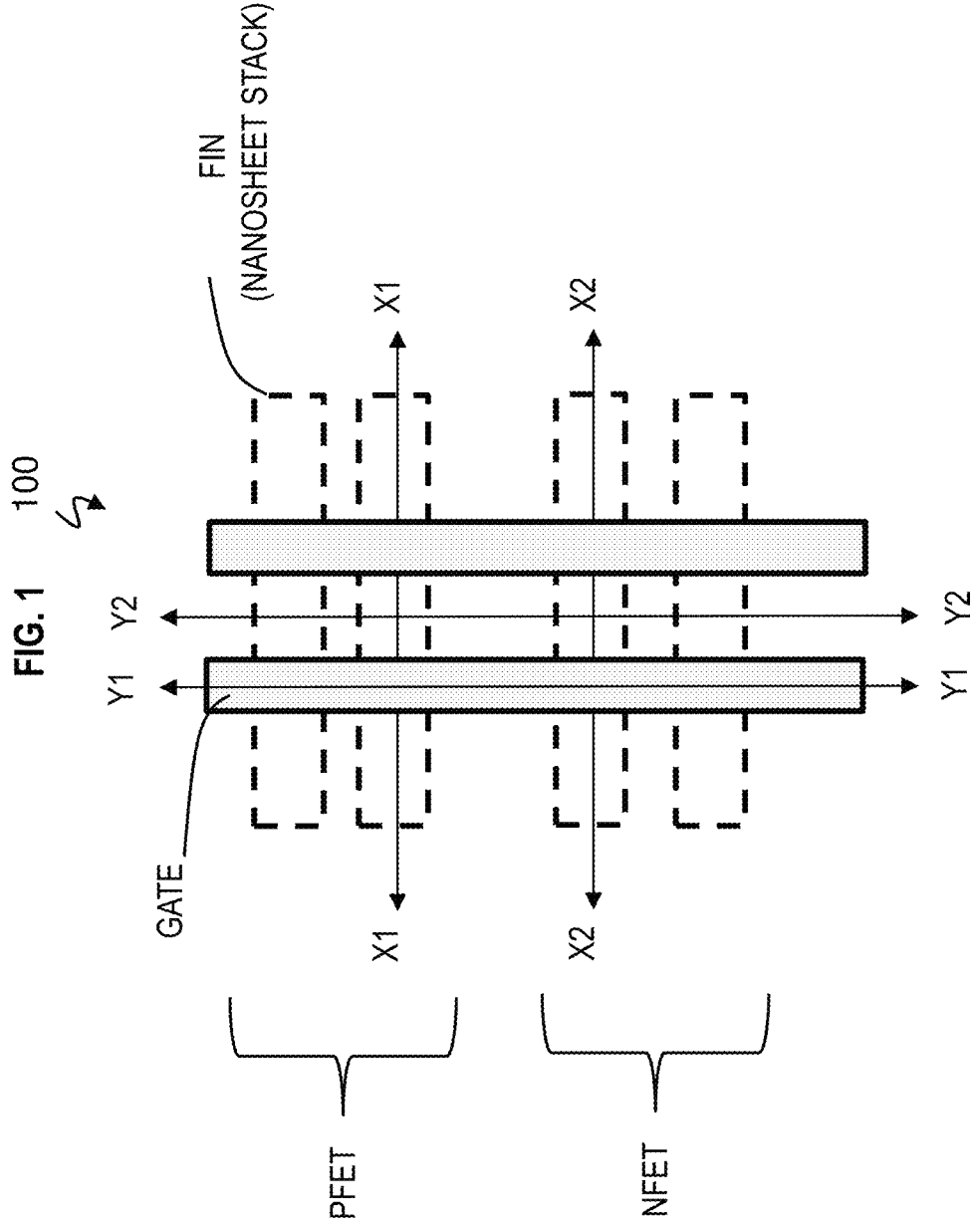
FIG. 1 depicts a top view of a simplified illustration of a portion of an integrated circuit (IC) according to embodiments of the invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

One or more embodiments of the invention describe methods and subsequent device/structures which provide a single nanosheet stack epitaxy integration for dual channels gate-all-around nanosheet with strained PFET and bottom dielectric isolation NFET. According to one or more embodiments, epitaxial silicon germanium (SiGe) channel is utilized for the PFET and epitaxial silicon for the NFET using a single stack approach, which is simpler to manufacture than typical dual channels proposals requiring the co-integration of multiple nanosheet stack epitaxies. The PFET is formed with an exposed substrate having a punch-through-stopper implant to enable strain engineering. The NFET is formed with a bottom dielectric isolation layer to completely eliminate the risk of parasitic Source-Drain leakage through the substrate.

For nanosheet devices on bulk substrate, the source/drain epitaxial layer grows from (i) the side of the silicon nanosheets and (ii) the bottom silicon substrate. This can lead to parasitic source/drain leakage through the sub-sheet region (i.e., through a portion of the bottom silicon substrate) harming the performance of the nanosheet devices.

As technical solutions to one or more issues and/or technical benefits, one or more embodiments of the invention can provide bottom dielectric isolation of the source/drain epitaxial layer from the substrate to prevent leakage, thereby providing optimal electrical performance at any desired gate length (e.g., about 12 nanometers or below) for an NFET. Strain engineering is utilized for the PFET to meet device performance targets, by having an exposed substrate to generate the bottom-up growth component for a compressive epitaxy. One or more embodiments use epitaxial SiGe channel for the PFET and a silicon channel for the NFET, while using a single nanosheet stack approach meaning that the stacks/fins are simulataneously formed for the PFET and NFET. As such, the PFET with exposed substrate enables strain engineering, while the NFET with bottom dielectric isolation is to suppress leakage. By having a single nanosheet stack approach with dual channels, this avoids the problems with having to perform multi-stack integration, where the nanosheet stack for the PFET is grown separately from the nanosheet stack for the NFET.

One or more embodiments may include forming a punch-through-stopper (PTS) implant, growing a nanosheet epitaxy stack with a sacrificial high-Ge % layer, forming the fin and shallow trench isolation layer, and forming dummy gates. One or more embodiments may include forming a bottom dielectric isolation cavity selectively on NFET devices by removing the high-Ge % layer, forming simultaneously the PFET/NFET gate spacer and the NFET bottom dielectric isolation, and forming PFET source/drain cavities, inner spacers, and source/drain epitaxy. One or more embodiments may further include forming NFET source/drain cavities, inner spacers, and source/drain epitaxy, depositing interlayer dielectric, planarizing and selectively removing dummy gates, patterning PFET opening, and etching selectively sacrificial high-Ge % layer and silicon suspensions. One or more embodiments may include patterning NFET opening, etching selectively low-Ge % layer suspensions, forming PFET and NFET high-k metal gate final gate stack, forming gate cut and self-aligned contact cap, and forming source/drain trench metal contacts and gate.

Turning now to a more detailed description of aspects of the present invention, FIG. 1 depicts a top view of a simplified illustration of a portion of an integrated circuit (IC) 100 for a single stack dual channel gate-all-around nanosheet device with strained PFET and bottom dielectric isolation for NFET. As depicted in FIG. 1, an "X1-X1" view is taken in the fin length direction of illustrating the PFET cross gate, while an "X2-X2" view it taken in the fin length direction illustrating the NFET cross gate. A "Y1-Y1" view is taken in the gate length direction illustrating the cross fin gate region, while the "Y2-Y2" view parallel to the gate length direction illustrating the cross fin source/drain region. FIG. 1 is representative of PFET fins, NFET fins, and gates formed according to fabrication processes discussed herein.

FIGS. 2-19B depict the IC 100 after selected fabrication operations have been completed for forming a single stack dual channel gate-all-around nanosheet device with strained PFET and bottom dielectric isolation for NFET according to one or more embodiments of the invention. Standard semiconductor fabrication techniques can be utilized to fabricate IC 100 as understood by one of ordinary skill in the art. Any suitable lithography processes including deposition techniques and etching techniques can be utilized herein.

FIGS. 2A and 2B depict cross-sectional views of a portion of the IC 100 after fabrication operations according to one or more embodiments of the invention. In the examples depicted herein, the gate-all-around nanosheet devices of IC 100 will be formed in and above a semiconductor layer 200. The semiconductor layer 200 may have a variety of configurations, such as semiconductor-on-insulator (SOI) configuration that includes a bulk semiconductor layer, a buried insulation layer positioned on the bulk substrate, and one or more semiconductor material layers positioned on the buried insulation layer resulting in buried isolation scheme. In one or more embodiments, semiconductor layer 200 may be a bulk configuration. Also, semiconductor layer 200 may be made of silicon or it may be made of materials other than silicon, e.g., silicon-germanium, a III-V compound semiconductor material, etc. The semiconductor layer 200 may be referred to as the substrate. The terms "substrate" or "semiconductor substrate" should be understood to cover all semiconducting materials and all forms of such materials.

FIGS. 3A and 3B depict cross-sectional views of a portion of the IC 100 after fabrication operations according to one or more embodiments of the invention. Punch-through-stopper (PTS) implant is performed to form PTS (implant) layers 302 and 304. In FIG. 3A, the PFET region in the X1-X1 view is formed with the PTS layer 302 having one or more N-type dopants, while the NFET region in the X2-X2 view is formed with the PTS layer 304 having P-type dopants. In the Y1-Y1 view of FIG. 3B, the PFET region includes the PTS layer 302 adjacent to the PTS layer 304 in the NFET region. Analogously, in the Y2-Y2 view of FIG. 3B, the PFET region includes the PTS layer 302 adjacent to the PTS layer 304 in the NFET region.

FIGS. 4A and 4B depict cross-sectional views of the IC 100 at a point in fabrication where several process operations have been performed. First, nanosheet stack 400 of semiconductor material layers 402, 404, 406, 408, 410, 412, 414 is (simultaneously) formed above semiconductor layer 200 for both the PFET and NFET. The nanosheets stack 400 is formed by epitaxial growth from the underlaying PTS layers 302, 304. The semiconductor material layers 402, 404, 406, 408, 410, 412, 414 are made of different materials such that one or more nanosheets can be selectively etched (or removed) while not etching one or more other nanosheets, where some nanosheets are sacrificial layers, as discussed further herein. In one or more embodiments, the nanosheet stack 400 may be formed into fin-like structures (i.e., a stack of nanosheets having a narrow thickness compared to its length) as discussed further herein.

Figure 5B:
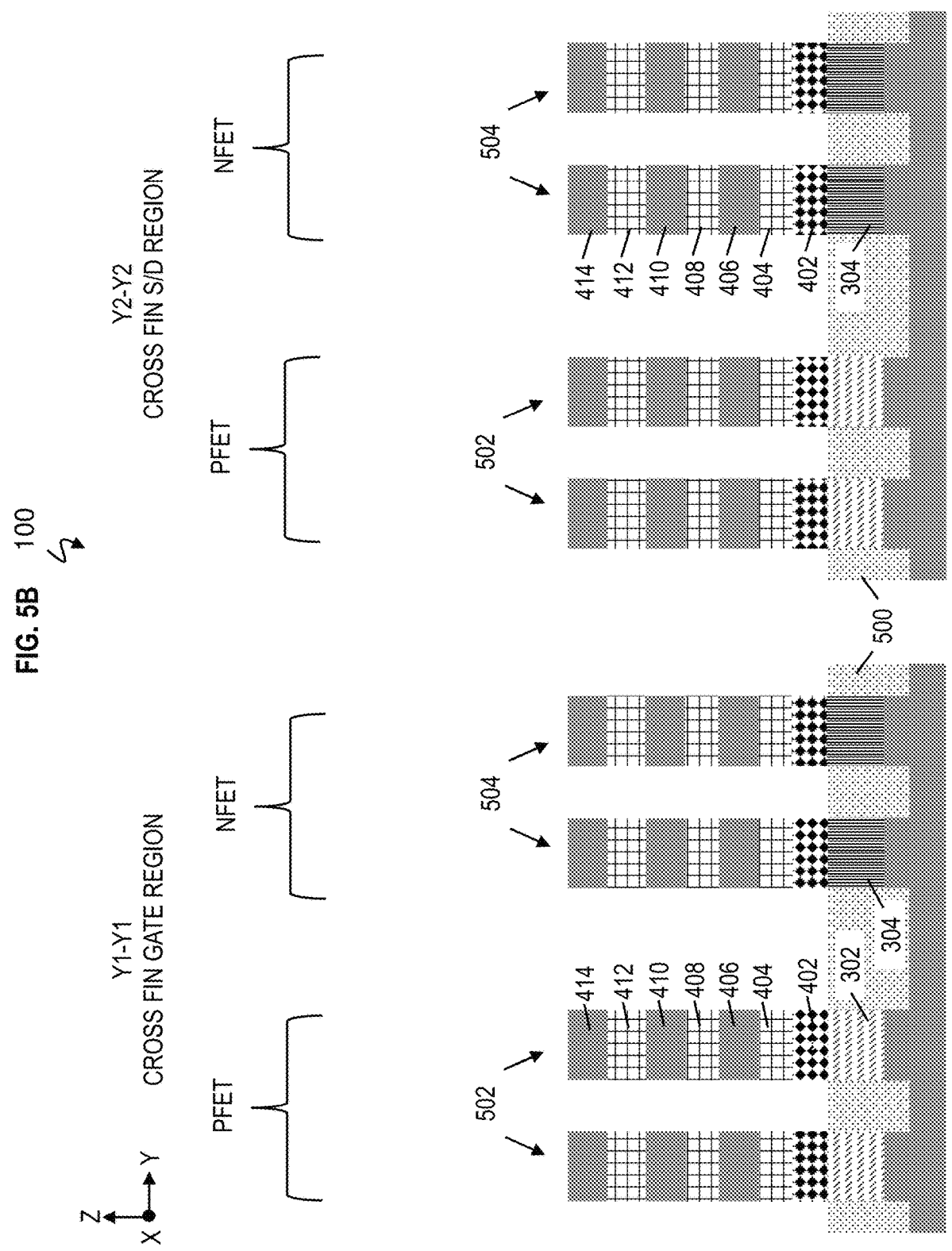

FIGS. 5A and 5B depict cross-sectional views of the IC 100 at a point in fabrication where several process operations have been performed. Fin and shallow trench isolation formation are performed. A patterned hard mask layer (e.g., silicon oxide, silicon nitride) is formed above the nanosheet stack 400. An etching process is performed using the patterned hard mask layer to define PFET stacks as PFET fins 502 and NFET stacks as NFET fins 504, as best seen in FIG. 5B. Reactive ion etching (RIE) may be utilized. The etching is through the semiconductor material layers 402, 404, 406, 408, 410, 412, 414, through the PTS layers 302, 304, and down through a portion of the underlying semiconductor layer 200, as seen in FIG. 5B. A shallow trench isolation layer 500 is formed on the semiconductor layer 200 up to the bottom of semiconductor material layer 402. The STI layer 500 may include a low-k dielectric material and/or ultralow-k dielectric material. The etching forms PFET fins 502 and NFET fins 504. Each fin may be representative of a different transistors. Although two PFET fins 502 are shown and two NFET fins 504 are shown, each PFET and NFET can have fewer or more than two fins.

Low-k dielectric materials may generally include dielectric materials having a k value of about 3.9 or less, such as silicon dioxide. The ultralow k dielectric material generally includes dielectric materials having a k value less than 2.5. Unless otherwise noted, all k values mentioned in the present application are measured relative to a vacuum. Exemplary ultralow k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultralow k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low k dielectric films can be formed by hydrolysis and polycondensation of an alkoxide(s) such as tetraetehoxysilane (TEOS).

In general, the semiconductor material layers 406, 410, 414 are each silicon layers (substantially pure silicon), the semiconductor material layers 404, 408, 412 are each silicon germanium (SiGe) layers, and the semiconductor material layer 402 is a SiGe layer with a higher GE percentage. In one or more embodiments, the semiconductor material layers 404, 408, 412 include SiGe where germanium has an atomic percent (%) of about 25% and may range from an atomic percent from about 15-35%, thereby leaving silicon with the remainder. In the SiGe material of the semiconductor material layer 402, the atomic percent of germanium may range from about 40-75%, while silicon is the remainder. In one or more embodiments, the thicknesses of semiconductor material layers 404, 406, 408, 410, 412, 414 may be about the same. In one or more embodiments, the thicknesses of the semiconductor material layers 404, 406, 408, 410, 412, 414 may vary depending upon the particular application and they need not have the same thicknesses. In examples depicted herein, the semiconductor material layers 404, 408, 412 will be utilized as the channel regions for the PFET devices, while the semiconductor material layers 406, 410, 414 will be utilized as the channel regions for the NFET devices.

Figure 6B:
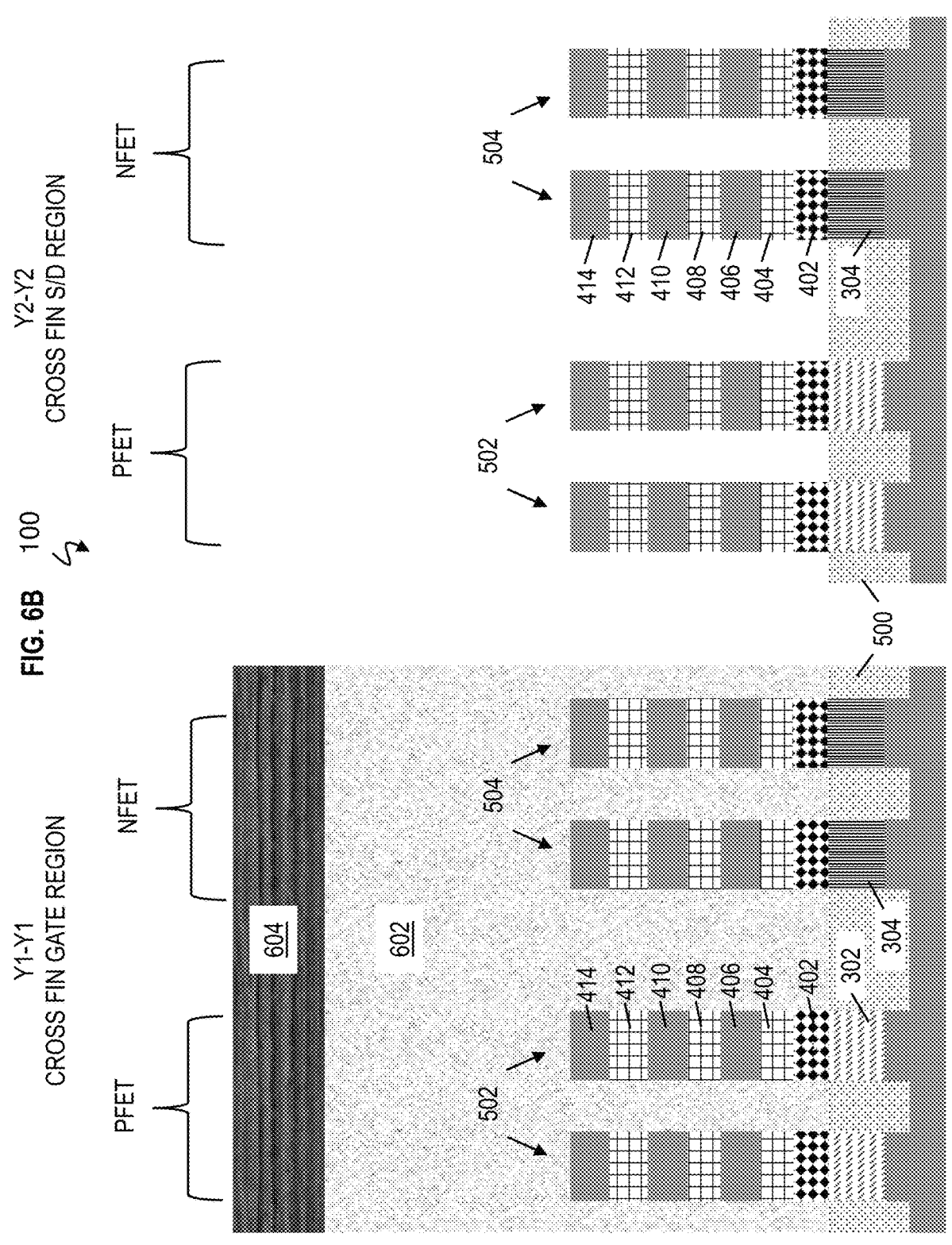

FIGS. 6A and 6B depict cross-sectional views of a portion of the IC 100 after fabrication operations according to one or more embodiments of the invention. Dummy gate formation is performed. Dummy gates 602 are formed using a patterned hard mask layer 604. The dummy gates 602 may be formed of amorphous silicon (a-Si) and the hard mask layer 604 may be formed of silicon nitride (SiN) or silicon oxide (SiO). Portions of the dummy gates 602 and hard mask layer 604 are removed, as seen in the Y1-Y1 view of FIG. 6B.

Figure 7B:
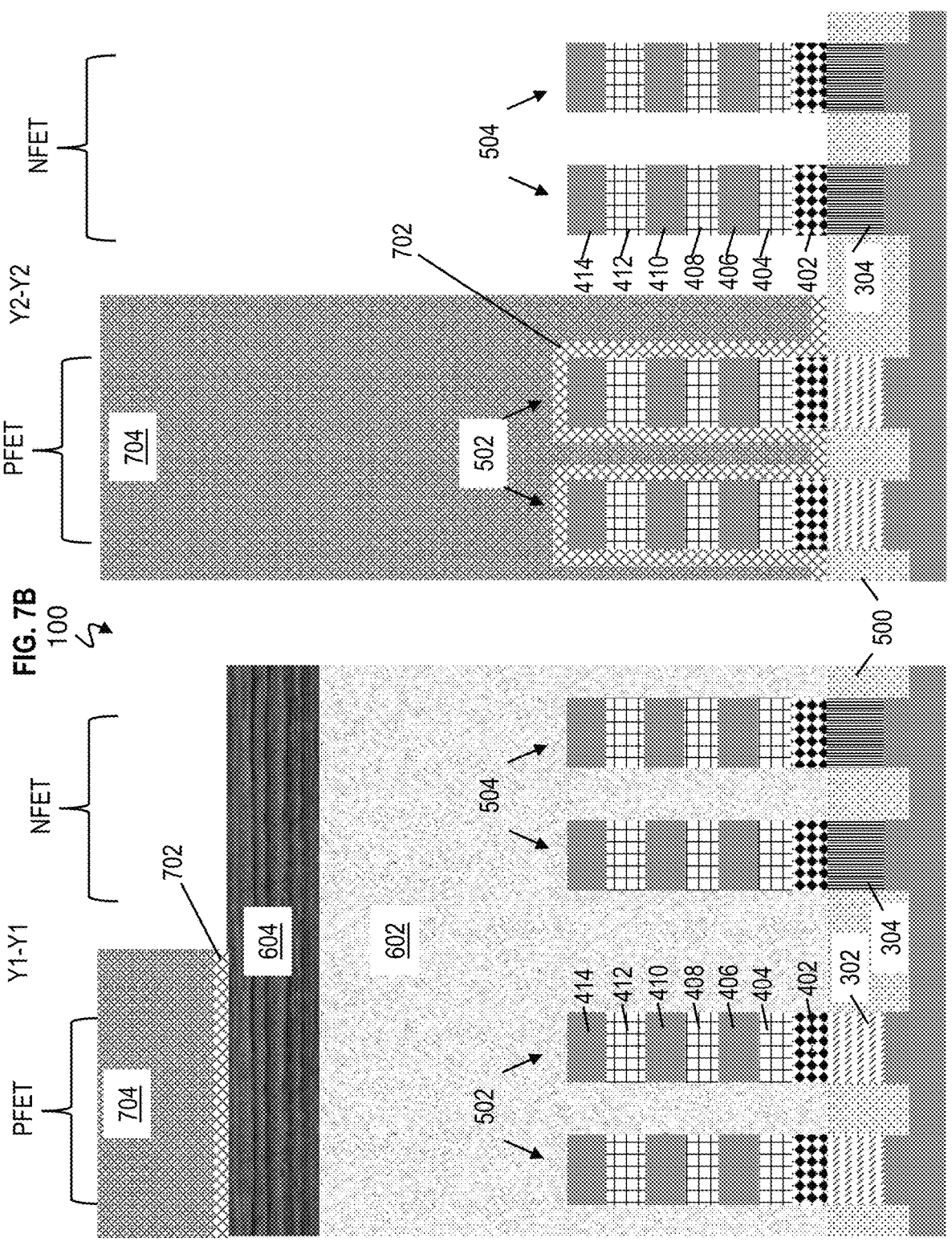

FIGS. 7A and 7B depict cross-sectional views of a portion of the IC 100 after fabrication operations according to one or more embodiments of the invention. Protective oxide liner deposition and oxide liner etch back are performed. A protective oxide liner 702 is conformally deposited on the IC 100, and a mask 704 is deposited on the oxide liner 702. The oxide liner 702 can be an oxide material, such as silicon dioxide, aluminum oxide, etc. The mask 704 may be an organic planarization layer (OPL). To prepare the NFET region, the mask 704 and oxide liner 702 are etched back to expose the NFET region in FIGS. 7A and 7B. A photosensitive layer (not shown) may be utilized to pattern the mask 704 and oxide liner 702.

Figure 8B:
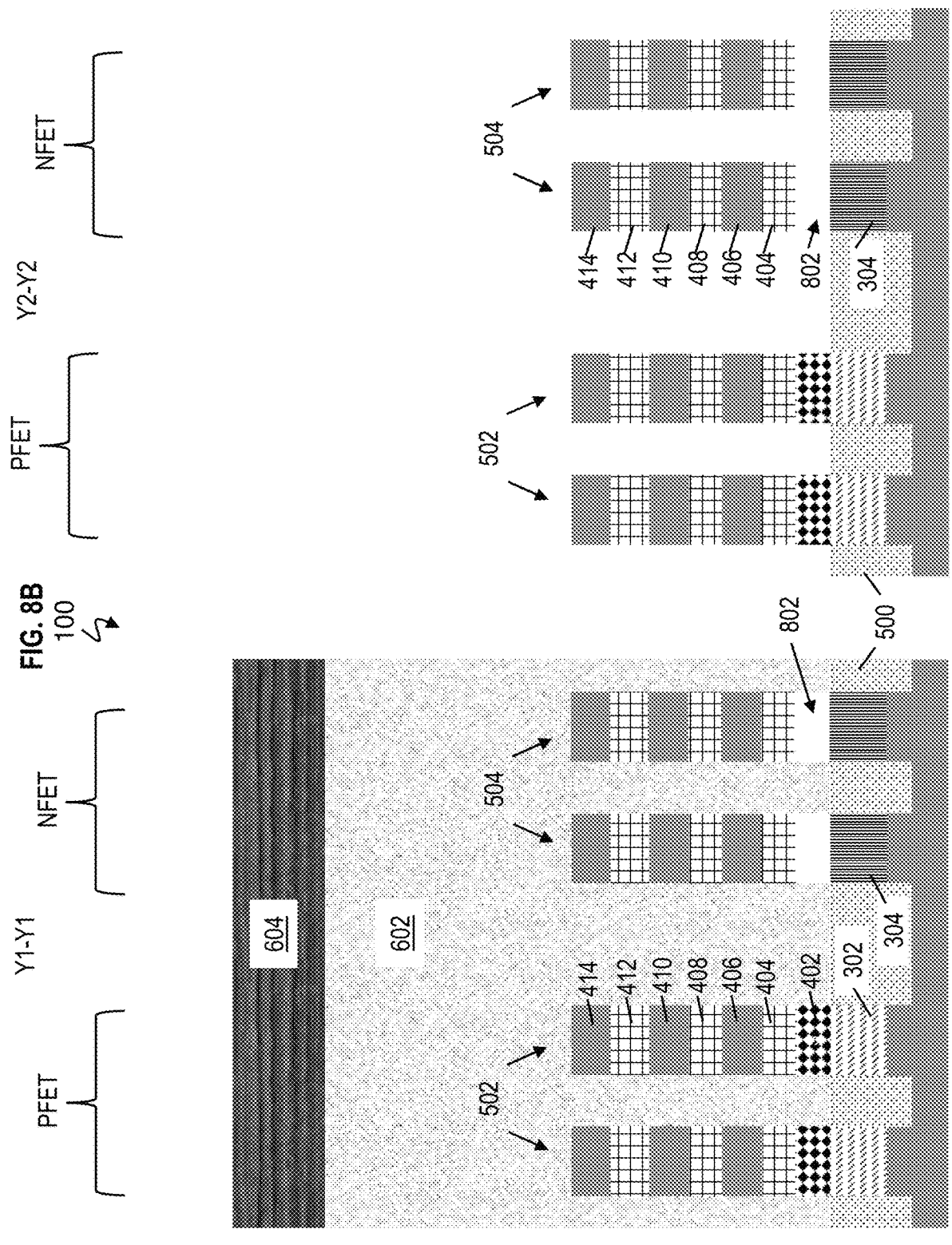

FIGS. 8A and 8B depict cross-sectional views of a portion of the IC 100 after fabrication operations according to one or more embodiments of the invention. Selective removal of the SiGe (with 50% Ge) is performed for the NFET devices. Etching is performed to selectively remove the semiconductor material layer 402 in the NFET regions without removing the semiconductor material layers 404, 406, 408, 410, 412, as well as not removing the semiconductor material layer 402 in the PFET regions. Moreover, the semiconductor material layer 402 remains in the PFET regions because the semiconductor material layer 402 was protected by the oxide liner 702 and mask 704, depicted in FIGS. 7A and 7B. The etching may be a wet etch or a dry etch. In one or more embodiments, the etching chemistry to selectively etch the semiconductor material layer 402 having SiGe with Ge of 50% may be vapor phase hydrochloric acid (HCl). The removal of the semiconductor material layer 402 in the NFET regions, results in open air gaps 802 or cavities. The gaps 802 are between the semiconductor material layer 404 above and the PTS layer 304 underneath, in the NFET regions. The mask 704 is stripped and the oxide liner 702 is stripped. The mask 704 may be removed prior to etching the semiconductor material layer 402 in the NFET regions, while the oxide liner 702 is present.

Figure 9A:
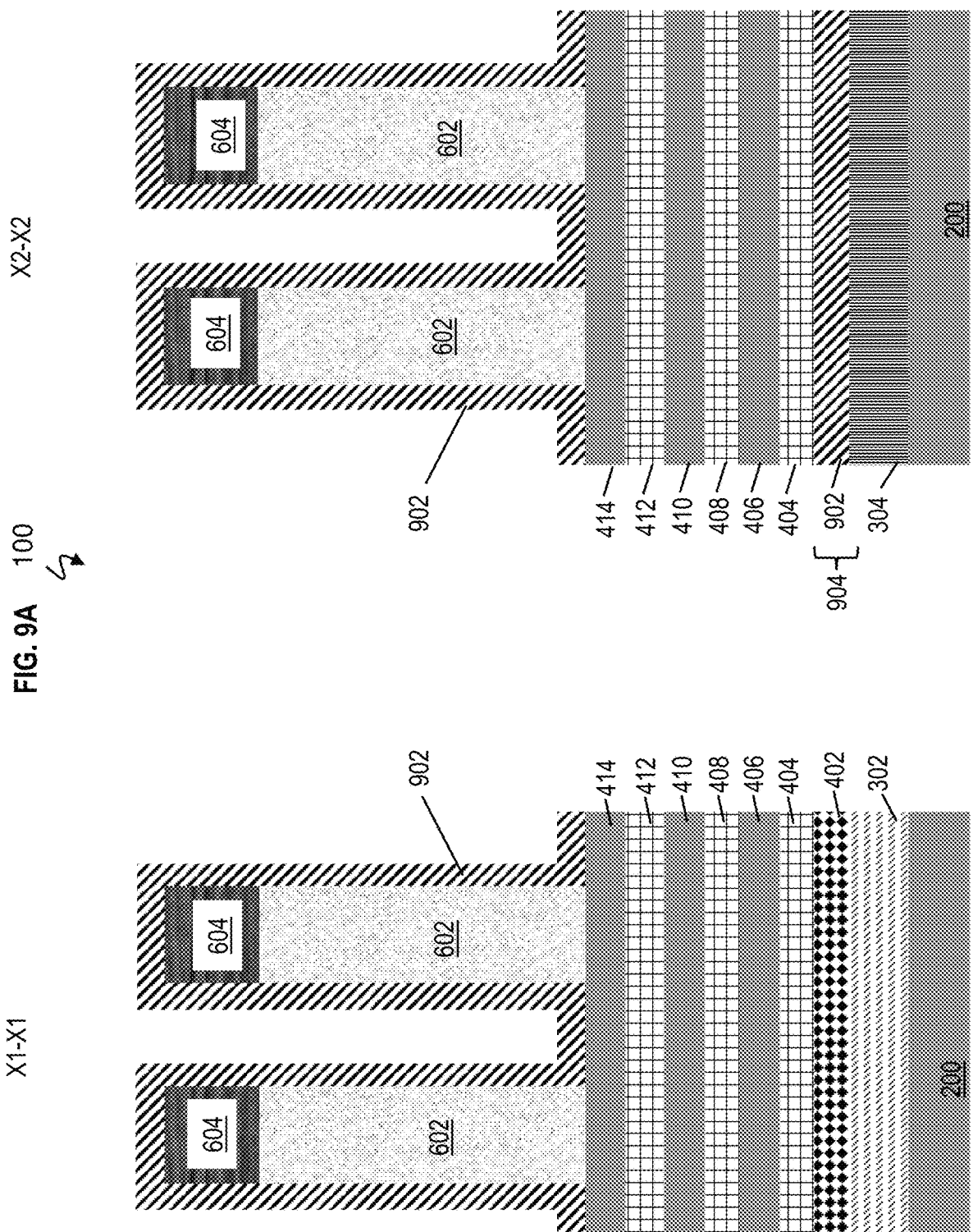
FIGS. 9A and 9B depict cross-sectional views of a portion of an IC under-fabrication after fabrication operations according to one or more embodiments of the invention.
Figure 9B:
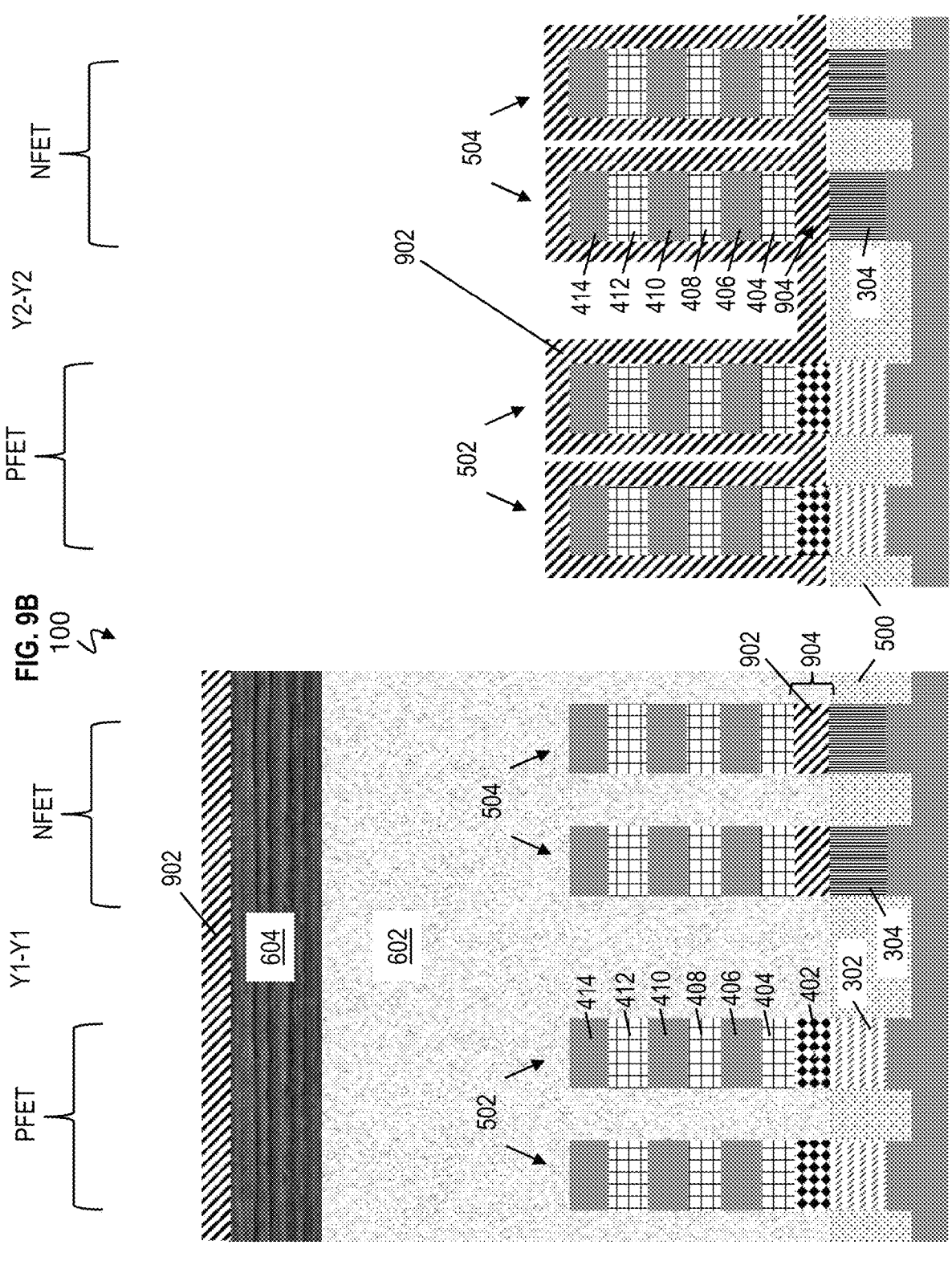

FIGS. 9A and 9B depict cross-sectional views of a portion of the IC 100 after fabrication operations according to one or more embodiments of the invention. Bottom dielectric formation is performed. Gate spacer material 902 is conformally deposited. Example materials of the gate spacer material 902 may include SiOC, SiCN, SiOCN, SiBCN, etc. The gate spacer material 902 covers the dummy gates 602, hard mask layers 604, the PFET fins 502, and the NFET fins 504, while the gate spacer material 902 simultaneously fills in the gaps 802, thereby forming a bottom dielectric layer 904 in the NFET region which will be for the NFET devices.

Figure 10A:
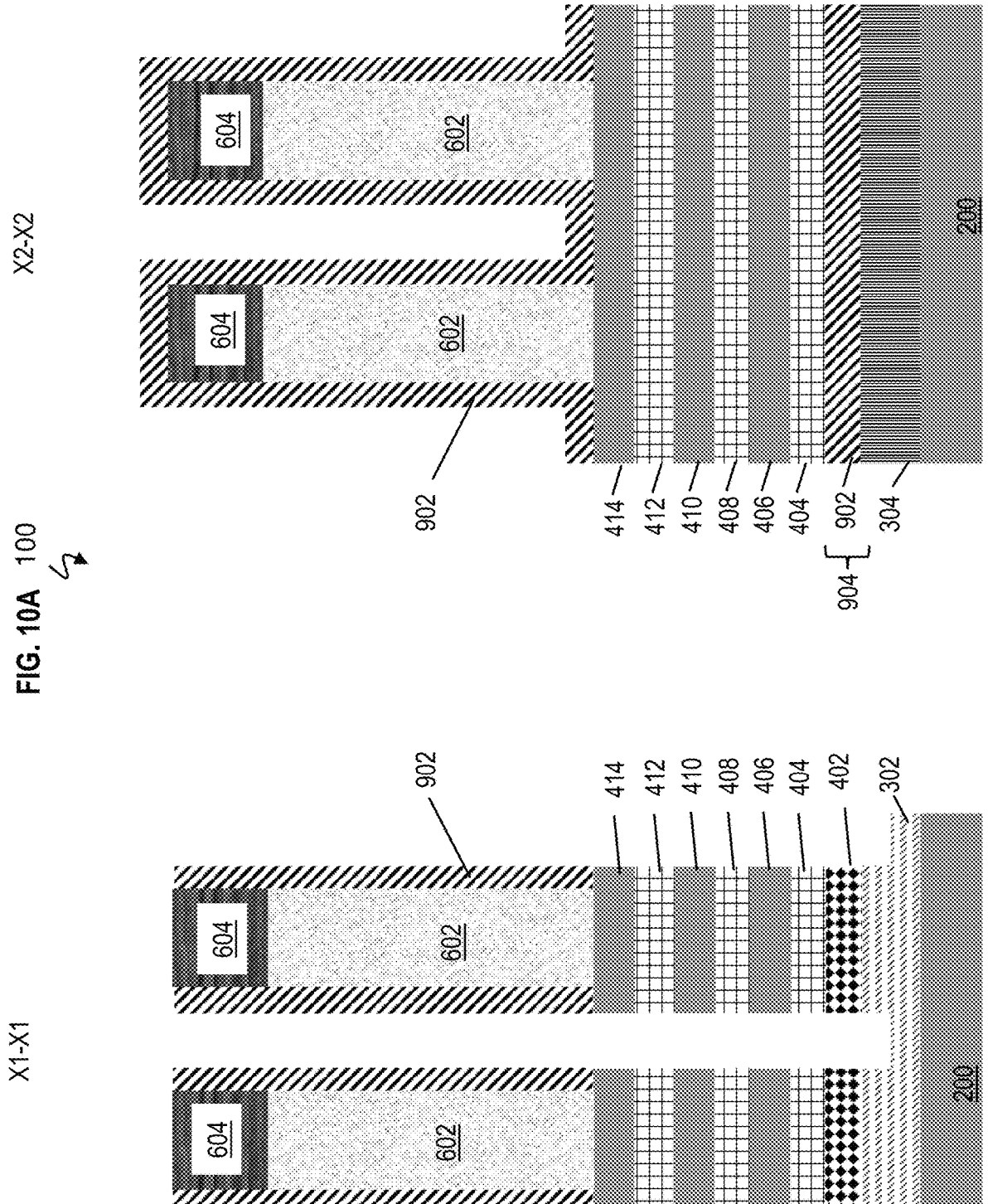
FIGS. 10A and 10B depict cross-sectional views of a portion of an IC under-fabrication after fabrication operations according to one or more embodiments of the invention.
Figure 10B:
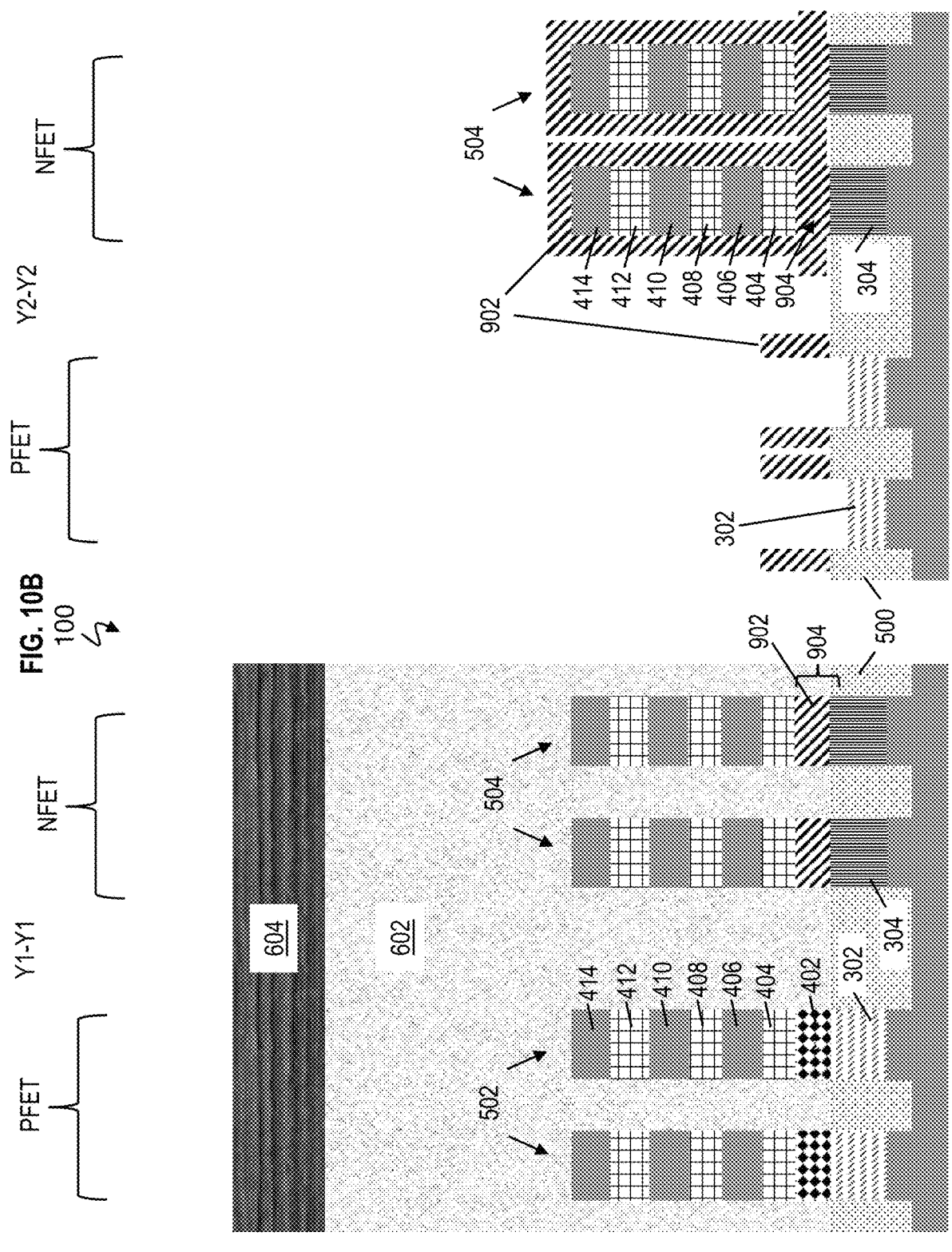

FIGS. 10A and 10B depict cross-sectional views of a portion of the IC 100 after fabrication operations according to one or more embodiments of the invention. A fin recess is performed in the PFET region in preparation to form the source and drain. Lithography is performed to open the PFET regions. A mask (not shown) may be used to protect the NFET regions as well as the gate regions, while the gate spacer material 902 is opened/removed over the PFET regions. An anisotropic etch is performed to etch the gate spacer material 902. A dry etch chemistry may be utilized. For example, an etchant including fluorocarbon based gases such as $CF_4$, $C_4F_8$, or $CH_3F$ may be utilized to selectively etch the gate spacer material 902. This results in a portion of the PFET fin 502 being exposed, in preparation for the fin recess in the PFET region. The fin recess is performed by etching portions of the PFET fins 502 as depicted in FIGS. 10A and 10B. The fin recess etches portions of the semiconductor layers 402, 404, 406, 408, 410, 412, 414 and the (N-type) PTS layer 302 in the PFET region, while the NFET region is protected. To perform the fin recess in the PFET region, an etchant including halogen based gases such as $Cl_2$, HBr, or $CF_4$ may be utilized.

Figure 11A:
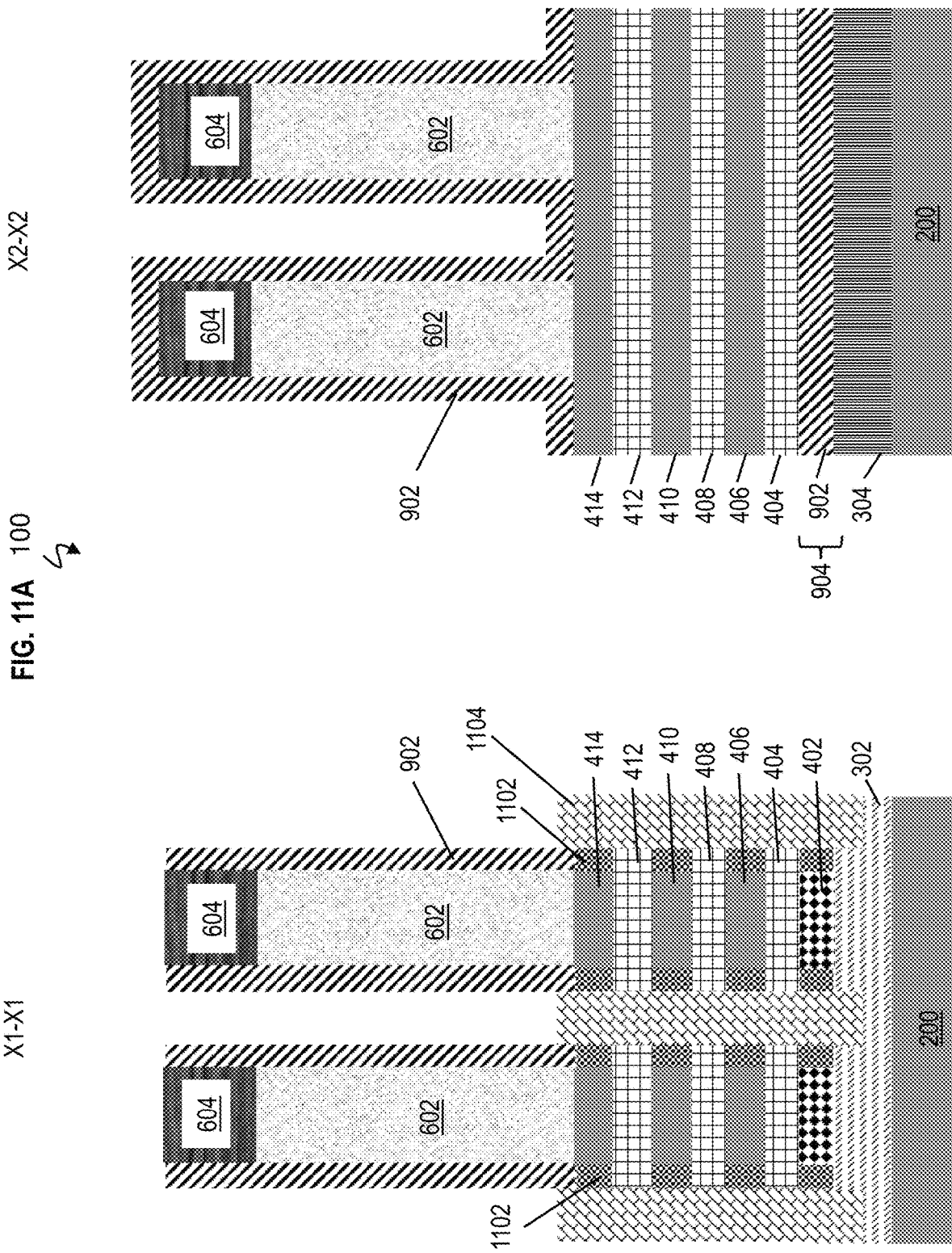
FIGS. 11A and 11B depict cross-sectional views of a portion of an IC under-fabrication after fabrication operations according to one or more embodiments of the invention.
Figure 11B:
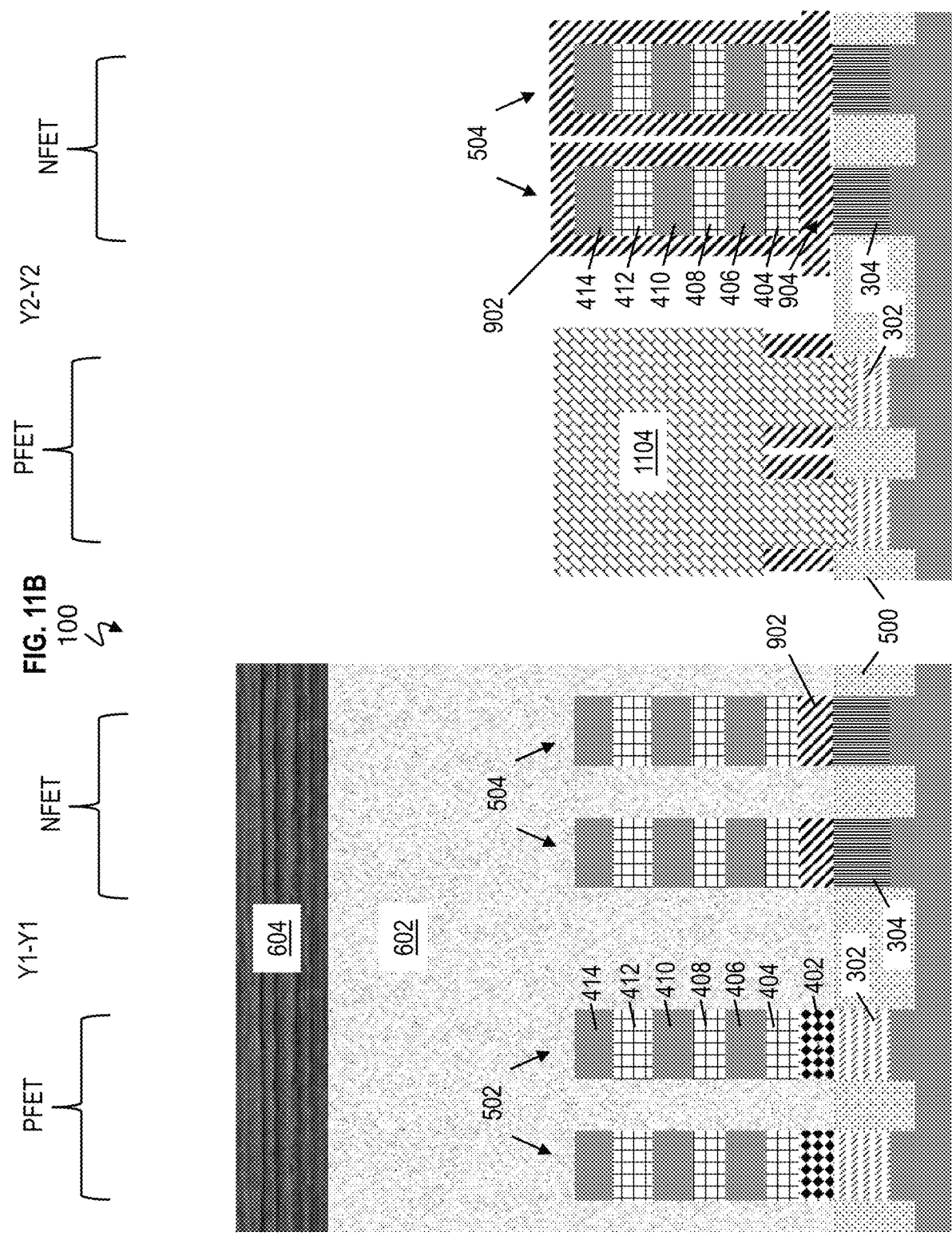

FIGS. 11A and 11B depict cross-sectional views of a portion of the IC 100 after fabrication operations according to one or more embodiments of the invention. PFET inner spacer formation and PFET source and drain regions are epitaxially formed. Etching is performed to selectively etch portions of (silicon) semiconductor layers 406, 410, 414, while not etching other layers in the PFET region, thereby resulting in the (Si) indentations in semiconductor layers 406, 410, 414. The etchant utilized to form the indentations in semiconductor layers 406, 410, 414 can include $NH_4OH$.

Etching is performed to selectively etch portions of (SiGe with Ge 50%) semiconductor layer 402, while not etching other layers in the PFET region, thereby resulting in the (SiGe with Ge 50%) indentations in semiconductor layer 402. The etchant utilized to form the indentations in semiconductor layer 402 can include HCl or $ClF_3$.

A conformal low-k dielectric (or ultralow-k) deposition of low-k dielectric material is performed, and then low-k dielectric etch back is performed, resulting in the formation of PFET inner spacers 1102, as depicted in FIG. 11A. The inner spacers 1102 may be formed of an insulation material. PFET epitaxial growth is performed to form source and drain regions 1104, as depicted in FIGS. 11A and 11B. The source/drain regions 1104 are epitaxially grown from the exposed edge of the SiGe channels 404, 408, 412 and the exposed portions of the PTS implanted substrate 302. The bottom-up epitaxial growth component enabled by the PTS implanted substrate layer 302 can help enable strain engineering for the PFET region. The epitaxial growth of the source/drain regions 1104 compresses on the channels from the sides, resulting in a compressive stress on the crystal lattice of the nanosheet channels. The epitaxial material of the source/drain regions 1104 can be a composite epitaxial material with a discrete or continuous silicon material doped with a p-type dopant such as boron (B) (Si:B) combined with silicon germanium doped with boron (SiGe:B). Silicon (Si:B) can be grown initially, and the remainder of the source/drain region 1104 is filled with silicon germanium (SiGe:B).

Figure 12A:
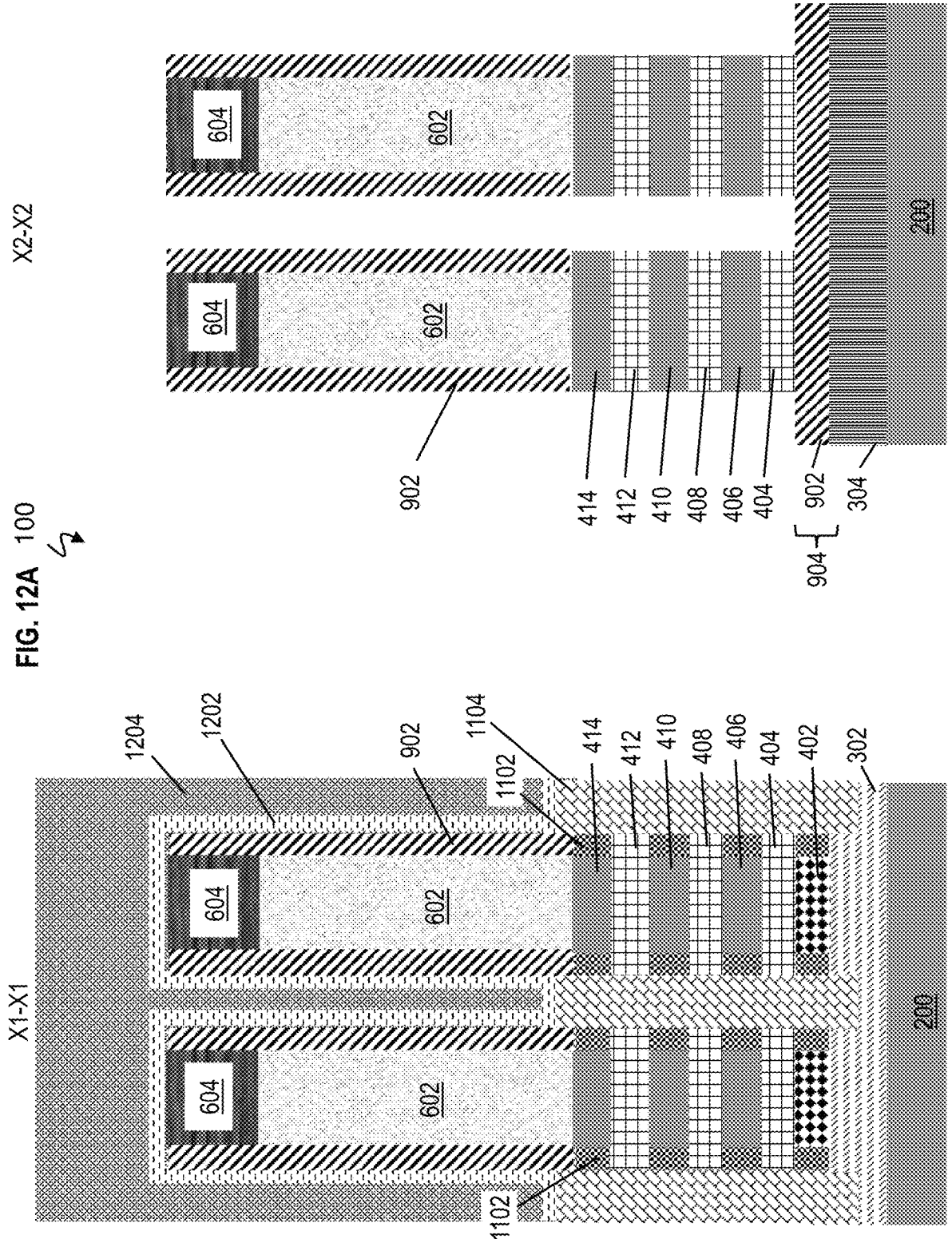
FIGS. 12A and 12B depict cross-sectional views of a portion of an IC under-fabrication after fabrication operations according to one or more embodiments of the invention.
Figure 12B:
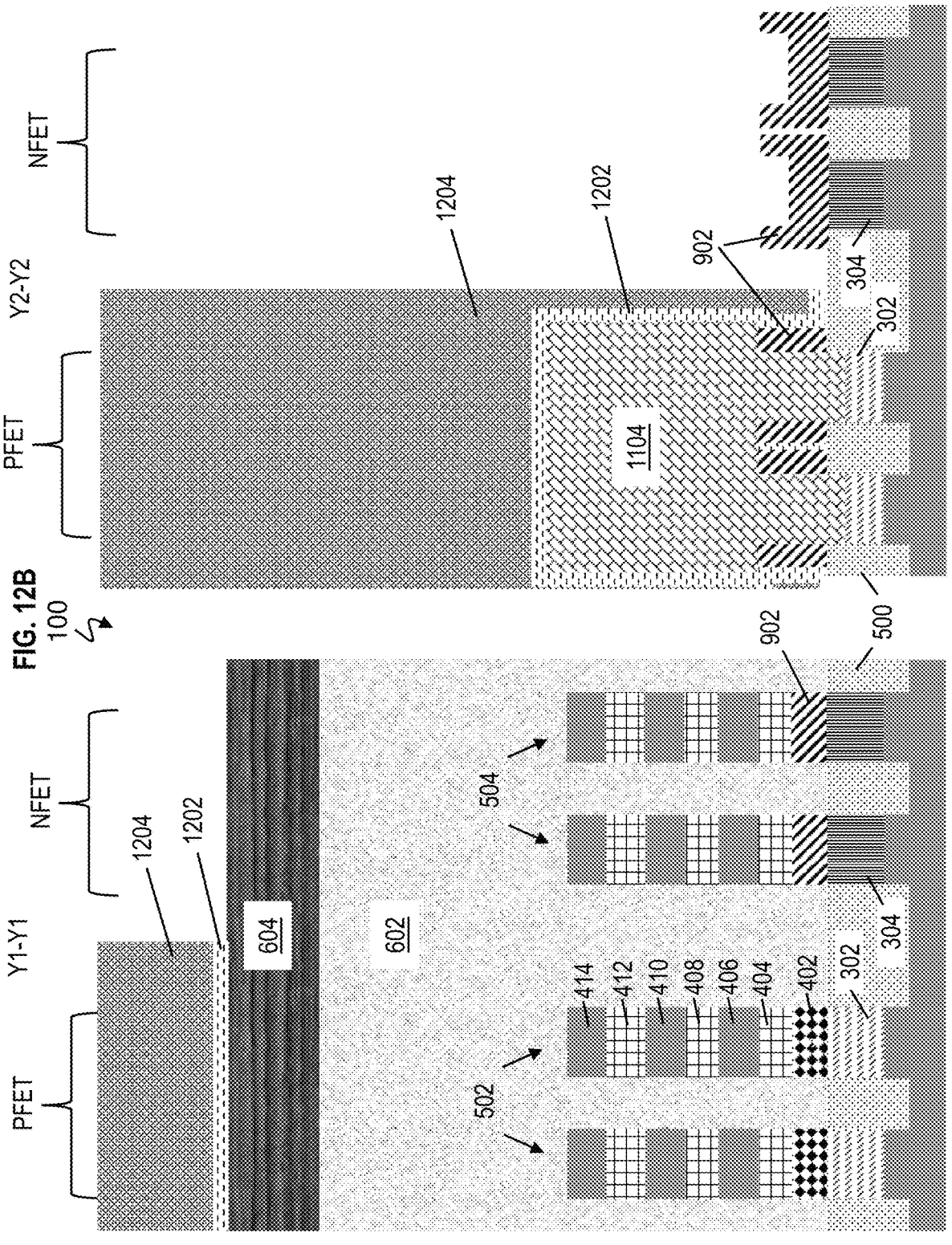

FIGS. 12A and 12B depict cross-sectional views of a portion of the IC 100 after fabrication operations according to one or more embodiments of the invention. A fin recess is performed in the NFET region in preparation for forming the source and drain. A protective oxide liner 1202 is deposited, and a mask 1204 is deposited on top of the protective oxide linter 1202. The oxide liner may be aluminum oxide ($AlO_x$) material of about 2-3 nanometers (nm). The mask 1204 may be an OPL layer and/or an optical dispersive layer (ODL). Lithography is performed to open the NFET regions, while the PFET regions remain protected. An etch back (e.g., $AlO_x$ liner etch back) of the protective oxide liner 1202 is performed in the NFET regions to expose the NFET fins 504.

In some ways, FIGS. 12A and 12B are analogous to the description of FIGS. and 10B but instead apply to the NFET regions. An anisotropic etch is performed to etch the gate spacer material 902 in the NFET regions, so as to open the NFET region. It is noted that the etching stops on a top surface of the bottom dielectric isolation layer 904. A dry etch chemistry may be utilized. For example, an etchant including fluorocarbon based gases such as $CF_4$, $C_4F_8$, $CH_3F$ may be utilized to selectively etch the gate spacer material 902. This results in a portion of the NFET fins 504 being exposed, in preparation for the fin recess in the NFET region. Fin recess is performed by etching portions of the NFET fins 504 as depicted in FIGS. 12A and 12B. The fin recess etches portions of the semiconductor layers 404, 406, 408, 410, 412, 414 without etching the bottom dielectric isolation layer 904 in the NFET region, while the PFET region is protected. To perform the fin recess in the NFET region, an etchant including halogen based gases such as $Cl_2$, HBr, or $CF_4$ may be utilized.

Figure 13A:
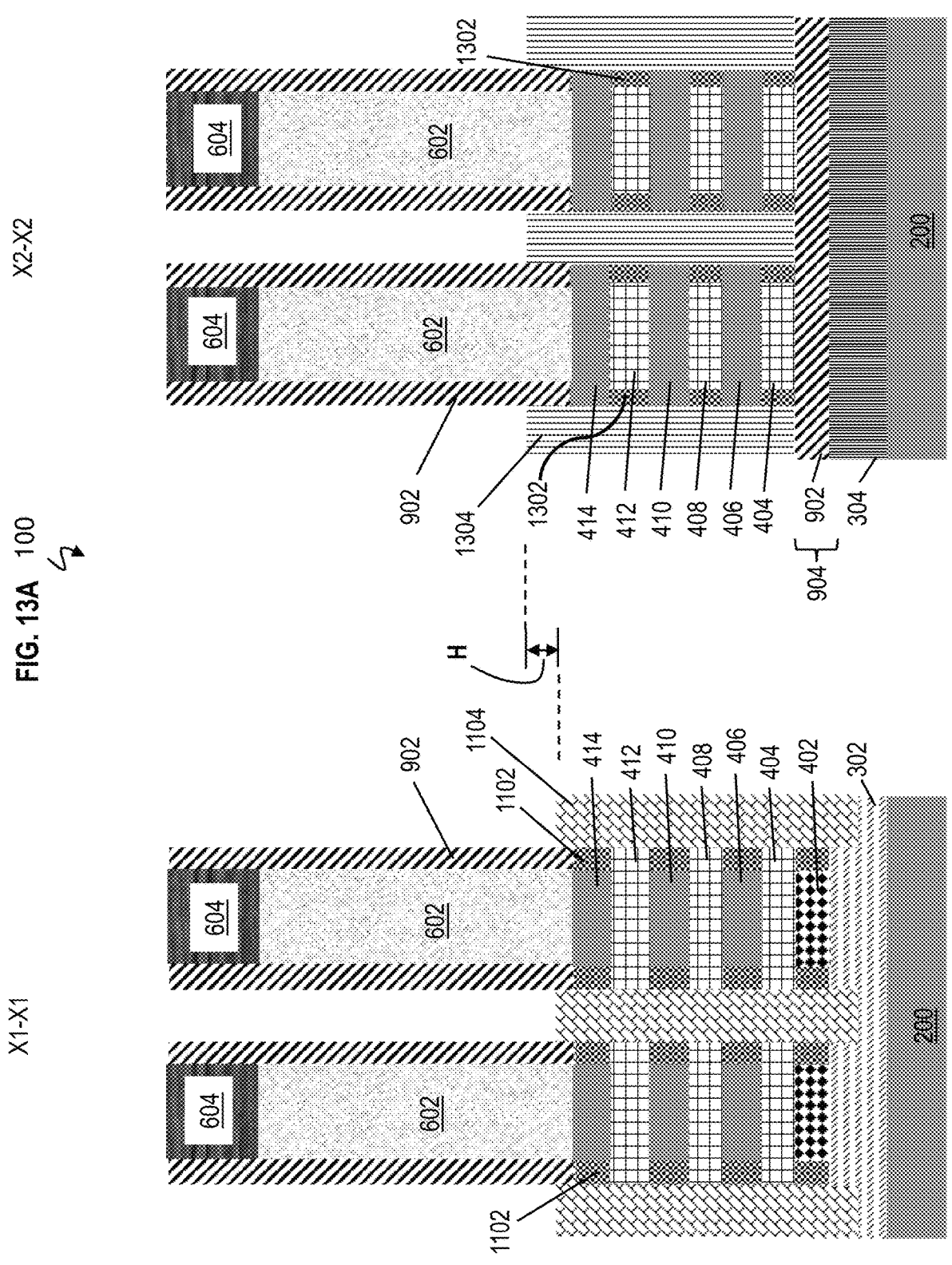
FIGS. 13A and 13B depict cross-sectional views of a portion of an IC under-fabrication after fabrication operations according to one or more embodiments of the invention.
Figure 13B:
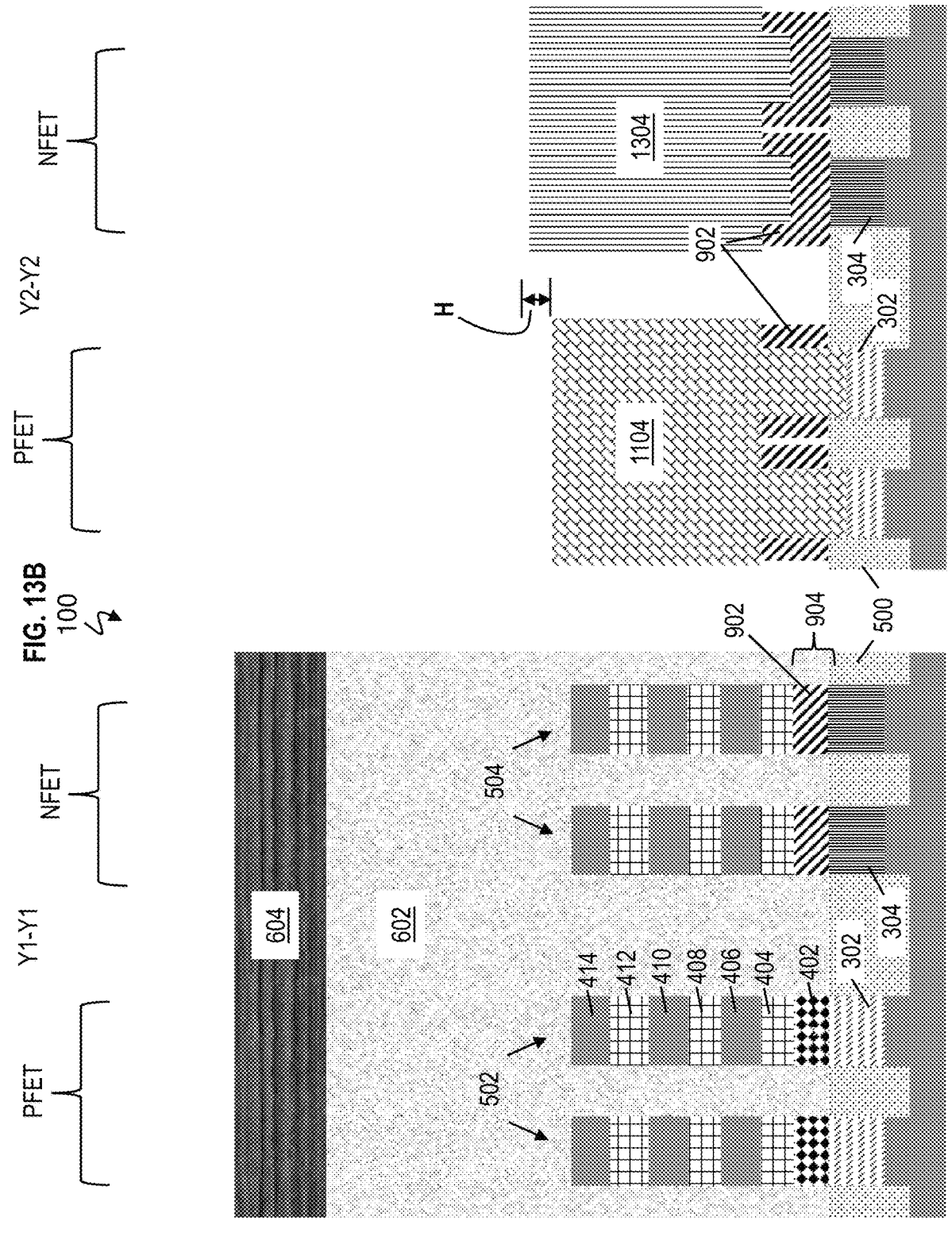

FIGS. 13A and 13B depict cross-sectional views of a portion of the IC 100 after fabrication operations according to one or more embodiments of the invention. NFET inner spacer formation is performed, and NFET source and drain regions are epitaxially grown. Etching is performed to selectively etch portions of semiconductor layers 404, 408, 412 in the NFET regions, while not etching other portions in the NFET region, thereby resulting in the (SiGe with Ge 25%) indentations in semiconductor layer 404, 408, 412.

A conformal low-k dielectric deposition of low-k dielectric material (or ultralow-k dielectric material) is performed, and then low-k dielectric etch back is performed, resulting in the formation of NFET inner spacers 1302, as depicted in FIG. 13A. The inner spacers 1302 may be formed of an insulation material. The mask 1204 is removed. NFET epitaxial growth is performed to form source and drain regions 1304, as depicted in FIGS. 11A and 11B. The source/drain regions 1304 are epitaxially grown from the exposed edge of the Si channels 406, 410, 414. The protective oxide liner 1202 is etched back in the PFET regions. The channel layers in the PFET regions are staggered from the channel layers in the NFET regions in the vertical direction (e.g., along the z-axis), which has a vertical difference H. Particularly, a top surface of the source/drain regions 1304 in the NFET region has a vertical distance H greater than the top surface of the source/drain regions 1104 in the PFET region, where the value of H is at least equal to or greater than the thickness of the bottom isolation layer 904.

Figure 14A:
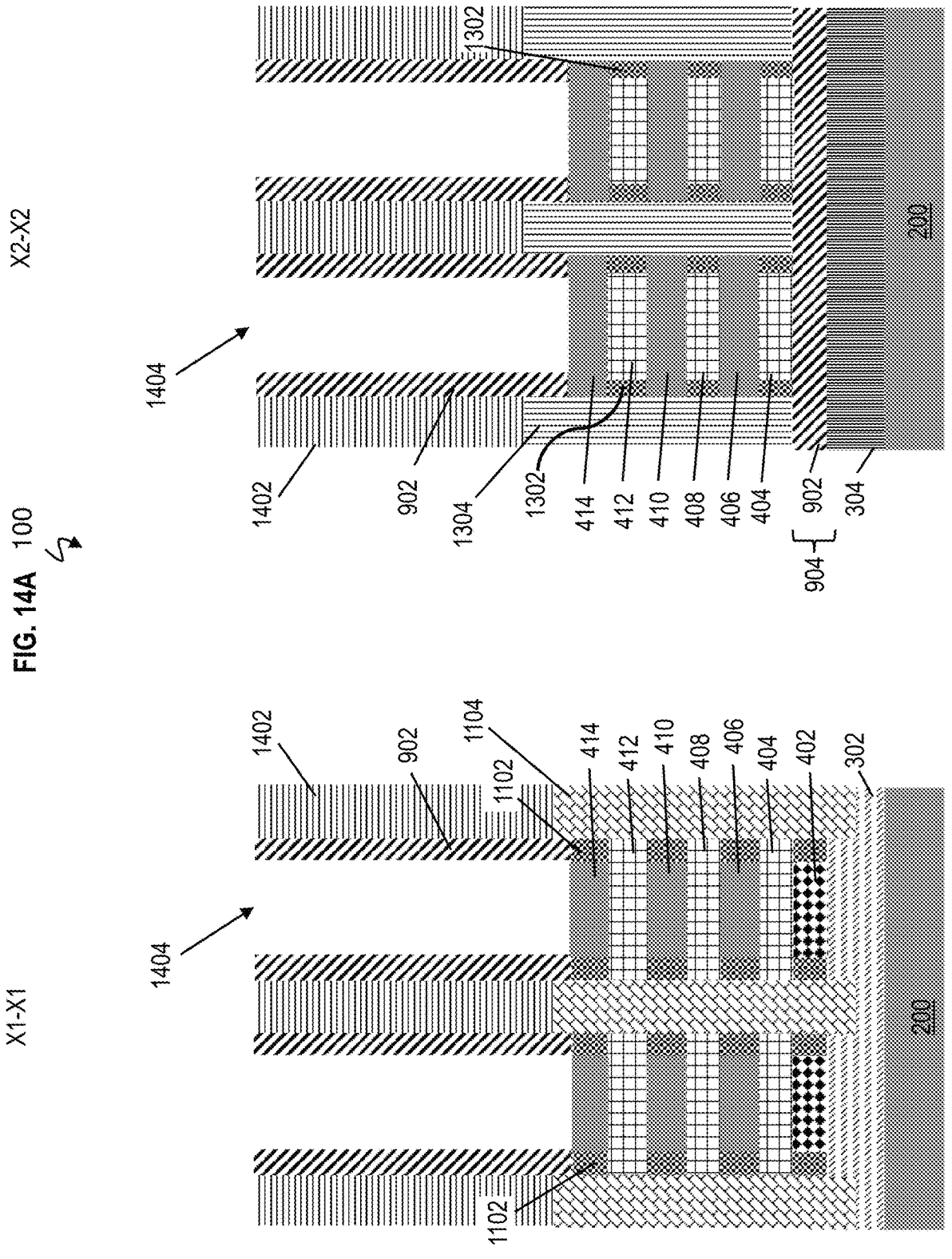
FIGS. 14A and 14B depict cross-sectional views of a portion of an IC under-fabrication after fabrication operations according to one or more embodiments of the invention.
Figure 14B:
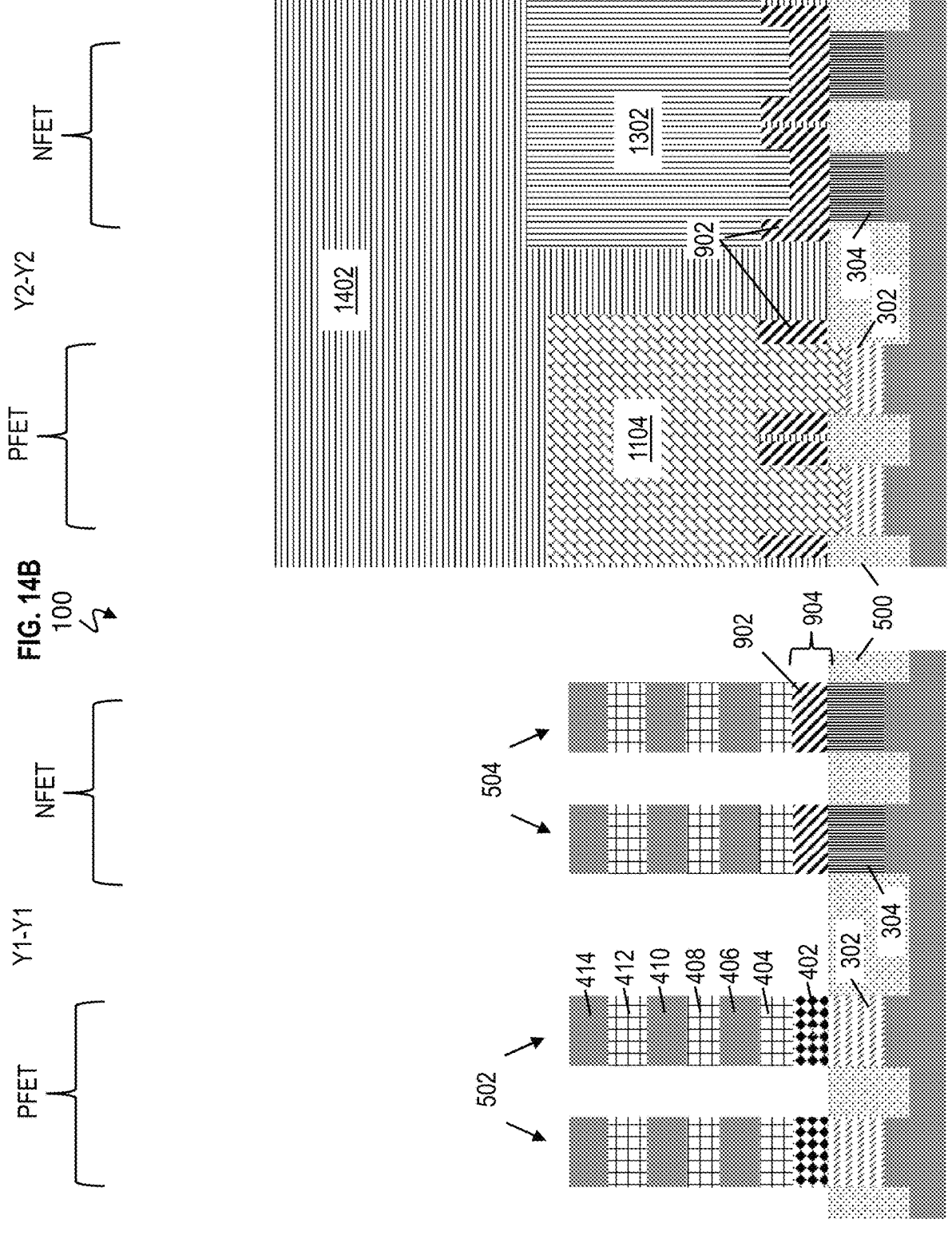

FIGS. 14A and 14B depict cross-sectional views of a portion of the IC 100 after fabrication operations according to one or more embodiments of the invention. To start the replacement metal gate process, FIGS. 14A and 14B illustrate interlayer dielectric deposition, planarization, and selective dummy gate removal. An interlayer dielectric (ILD) layer 1402 is deposited. The ILD layer 1402 can be a low-k dielectric material or ultralow-k dielectric material. Planarization is performed to remove the hard mask layer 604. As the selective dummy gate removal, etching is performed to remove the material of the dummy gates 602, thereby leaving cavities 1404.

Figure 15A:
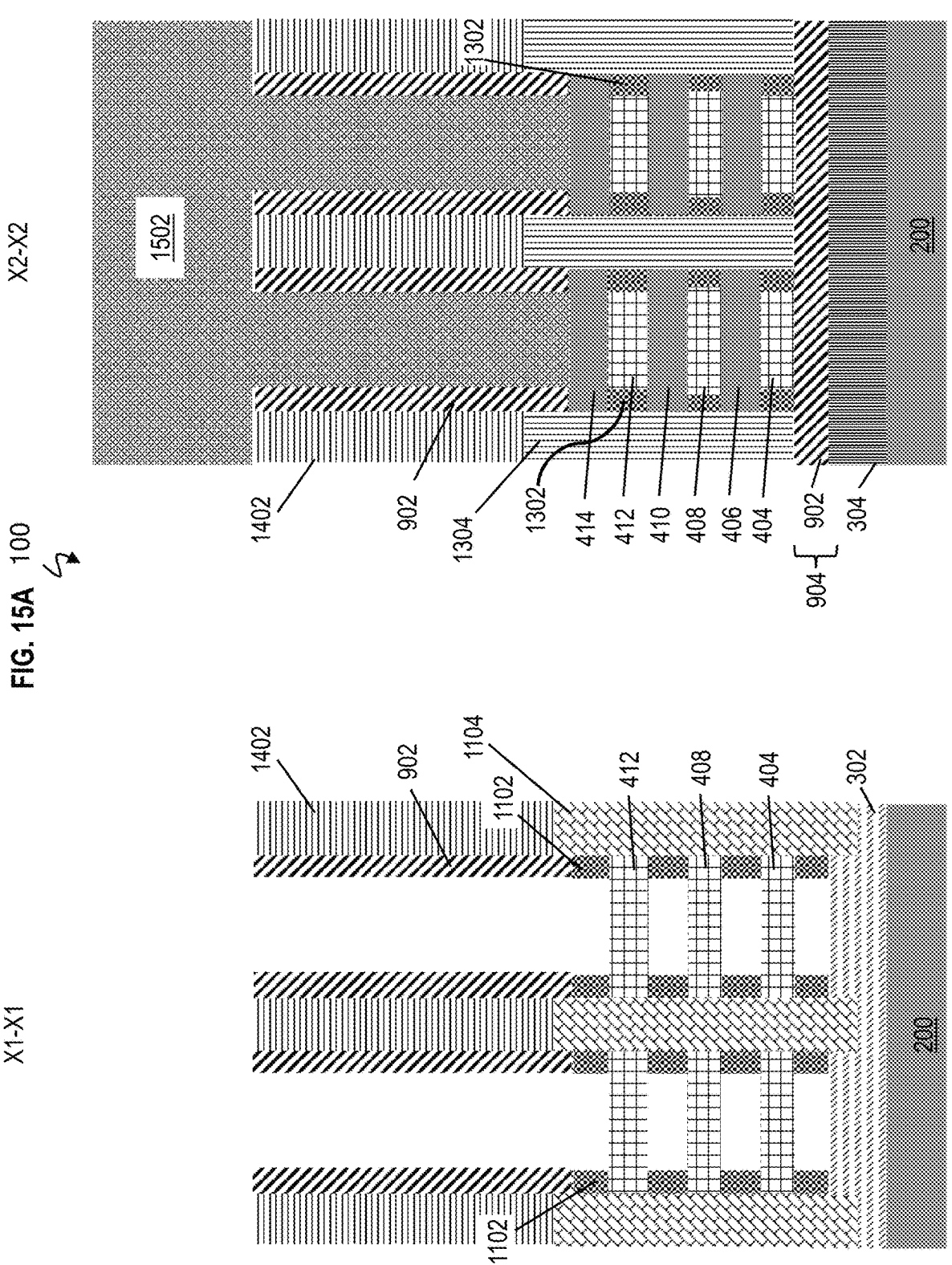
FIGS. 15A and 15B depict cross-sectional views of a portion of an IC under-fabrication after fabrication operations according to one or more embodiments of the invention.
Figure 15B:
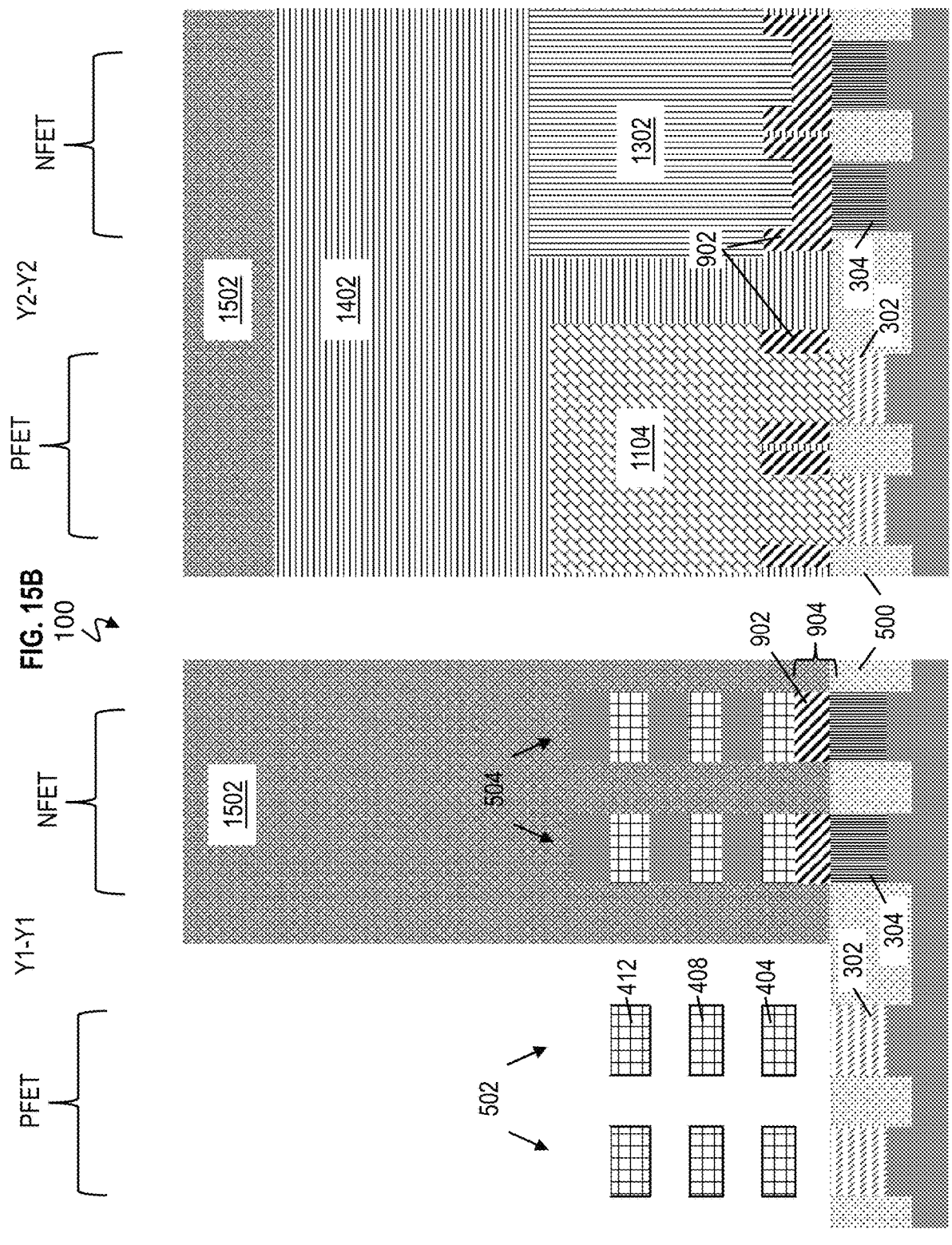

FIGS. 15A and 15B depict cross-sectional views of a portion of the IC 100 after fabrication operations according to one or more embodiments of the invention. A mask 1502 is deposited. The mask 1502 is patterned with an opening over the PFET regions, while the NFET regions remain protected. Etching is performed to selectively etch the semiconductor layer 402 (e.g., SiGe with 50% Ge), without etching other layers in the PFET regions. The etchant used to selectively etch the semiconductor layer 402 (e.g., SiGe with Ge having 50% atomic weight) may be vapor phase hydrogen chloride (HCl) based, which can be substantially different from the etchant to selectively remove SiGe with Ge having 25% atomic weight. Additionally, etching is performed to selectively etch the (silicon) semiconductor layer 406, 410, 414, without etching other layers in the PFET regions. The etchant used to selectively etch the silicon semiconductor layer 406, 410, 414 without etching the semiconductor layers 404, 408, 412 may be vapor phase $NH_4OH$. This results in openings above and below the semiconductor layers 404, 408, 412 in PFET fins 502.

Figure 16A:
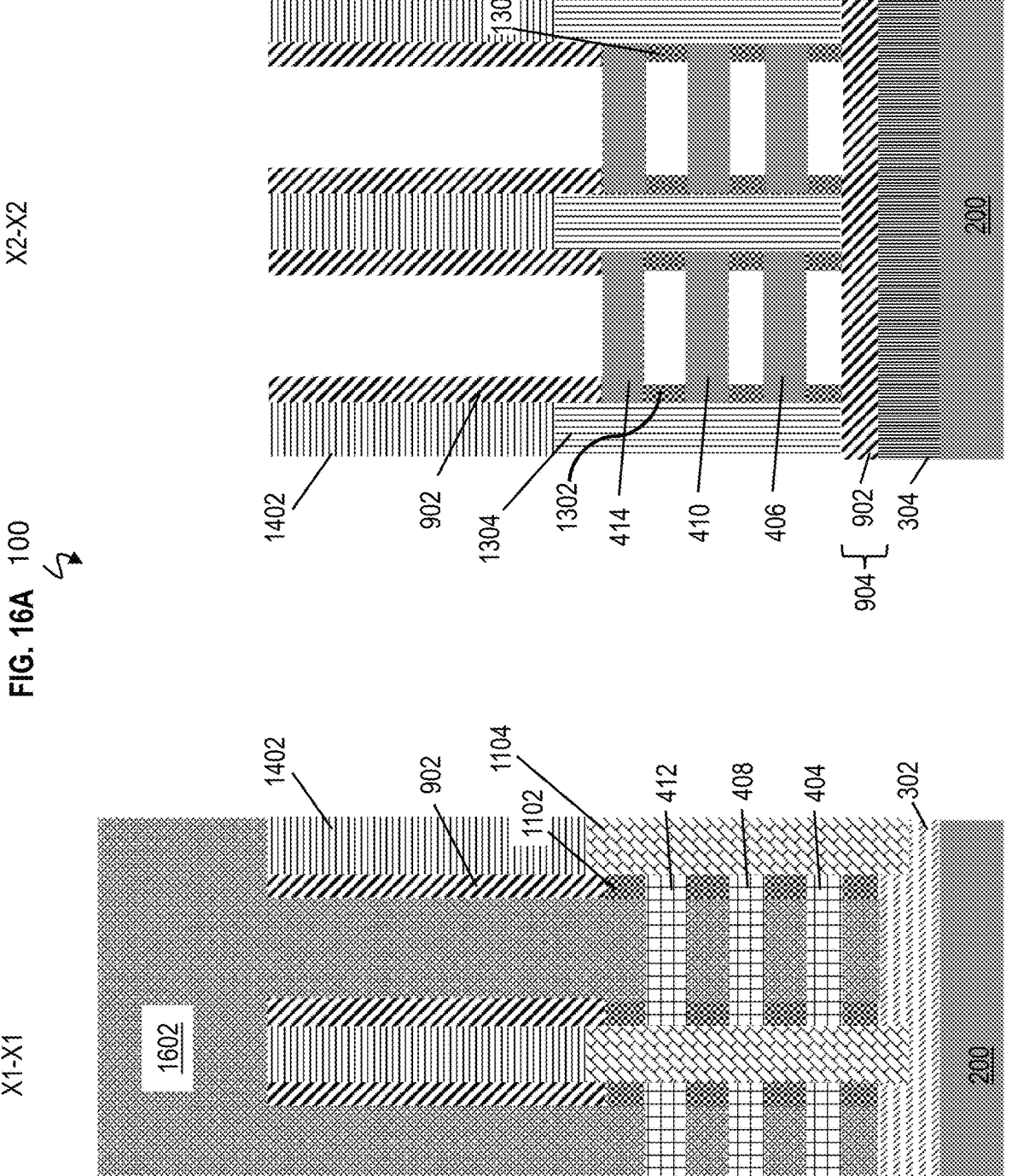
FIGS. 16A and 16B depict cross-sectional views of a portion of an IC under-fabrication after fabrication operations according to one or more embodiments of the invention.
Figure 16B:
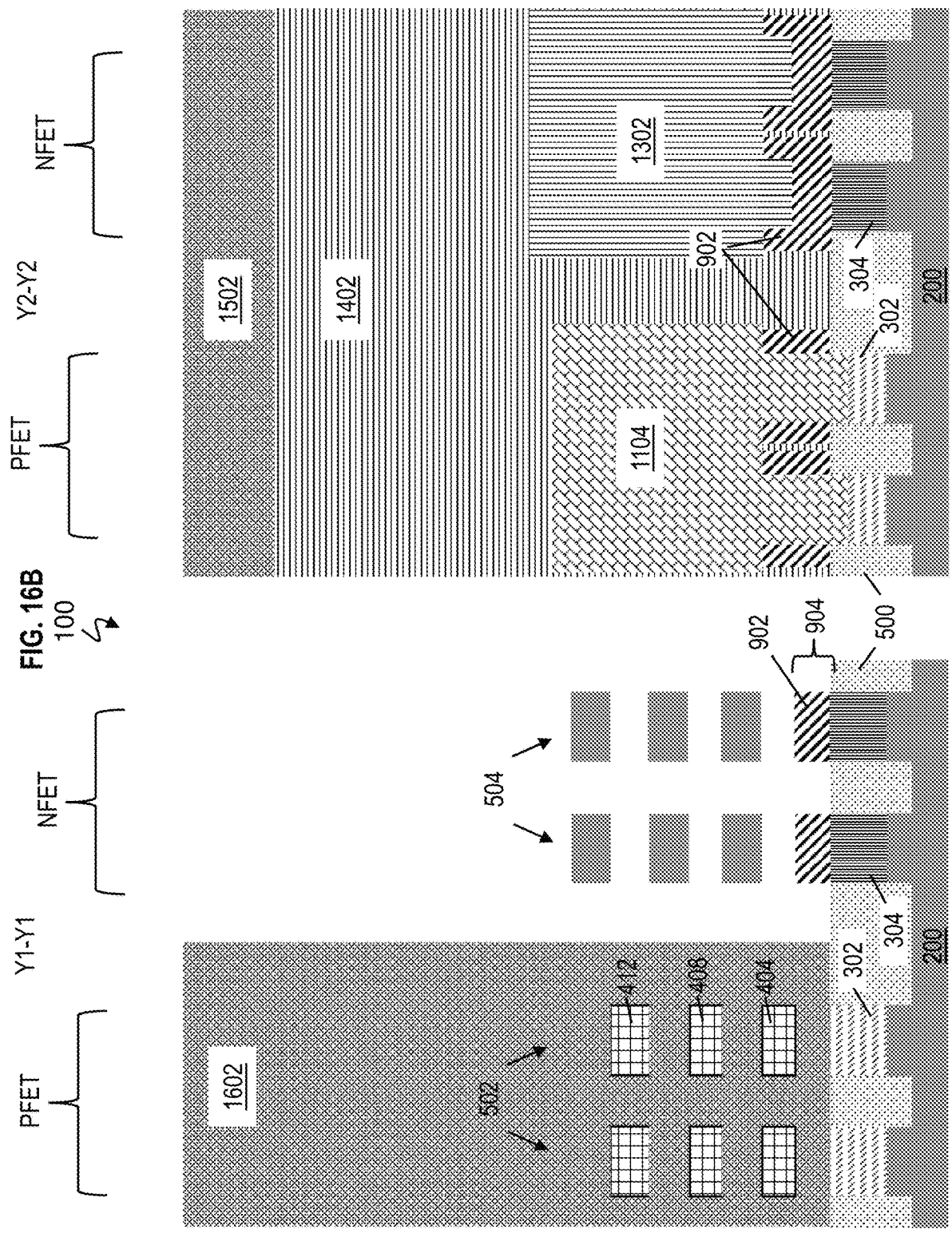

FIGS. 16A and 16B depict cross-sectional views of a portion of the IC 100 after fabrication operations according to one or more embodiments of the invention. A mask 1602 is deposited. The mask 1502 may have been previously removed before depositing mask 1602, or the mask 1602 may be deposited on the mask 1502 in the NFET region. Either way, the mask 1602 (and/or mask 1502) is opened in the NFET regions, while the PFET regions are protected. Etching is performed to selectively etch the semiconductor layers 404, 408, 412 (e.g., SiGe with 25% Ge), without etching other layers in the NFET regions. The etchant used to selectively etch the semiconductor layers 404, 408, 410 may include chlorine trifluoride ($ClF_3$).

Figure 17A:
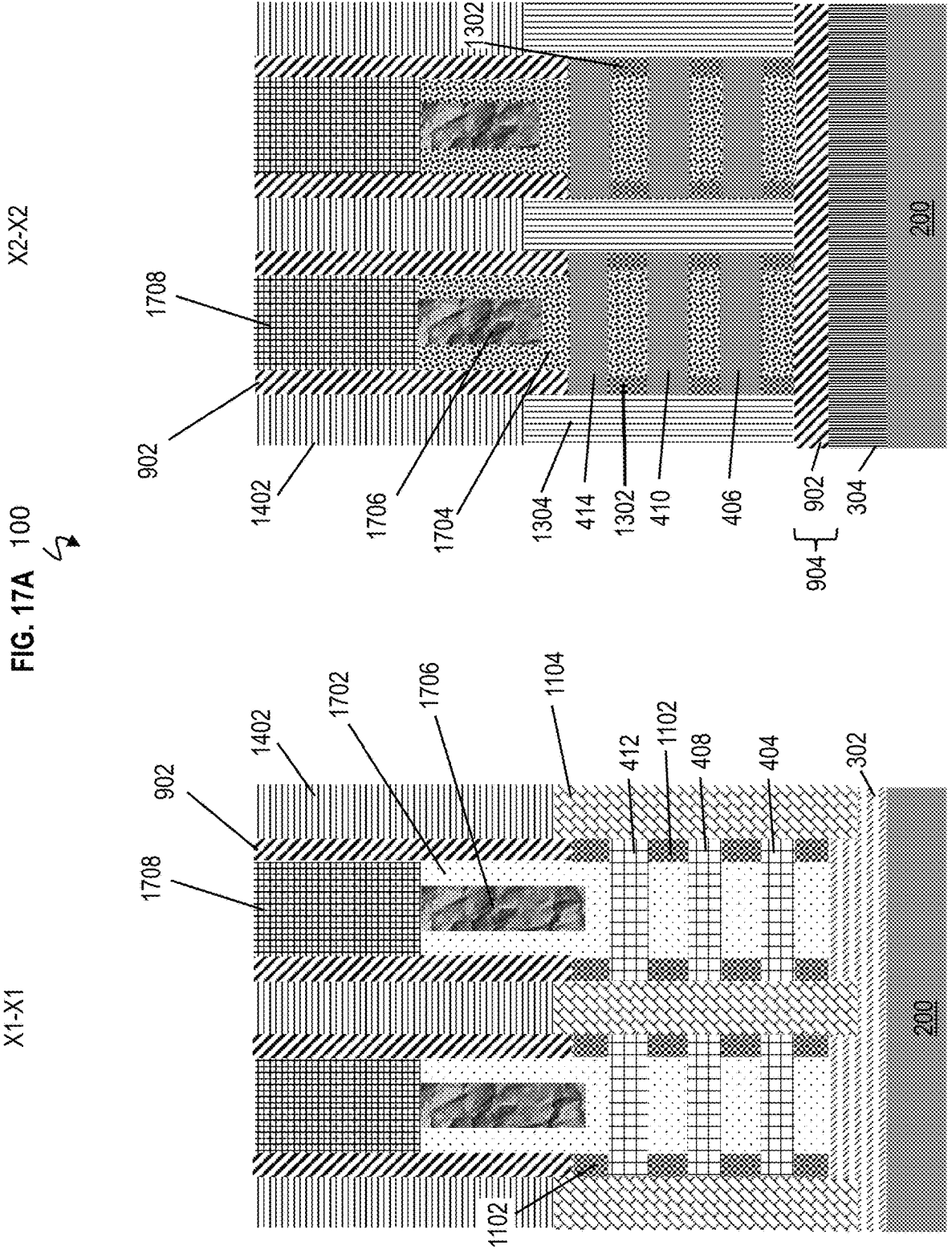
FIGS. 17A and 17B depict cross-sectional views of a portion of an IC under-fabrication after fabrication operations according to one or more embodiments of the invention.
Figure 17B:
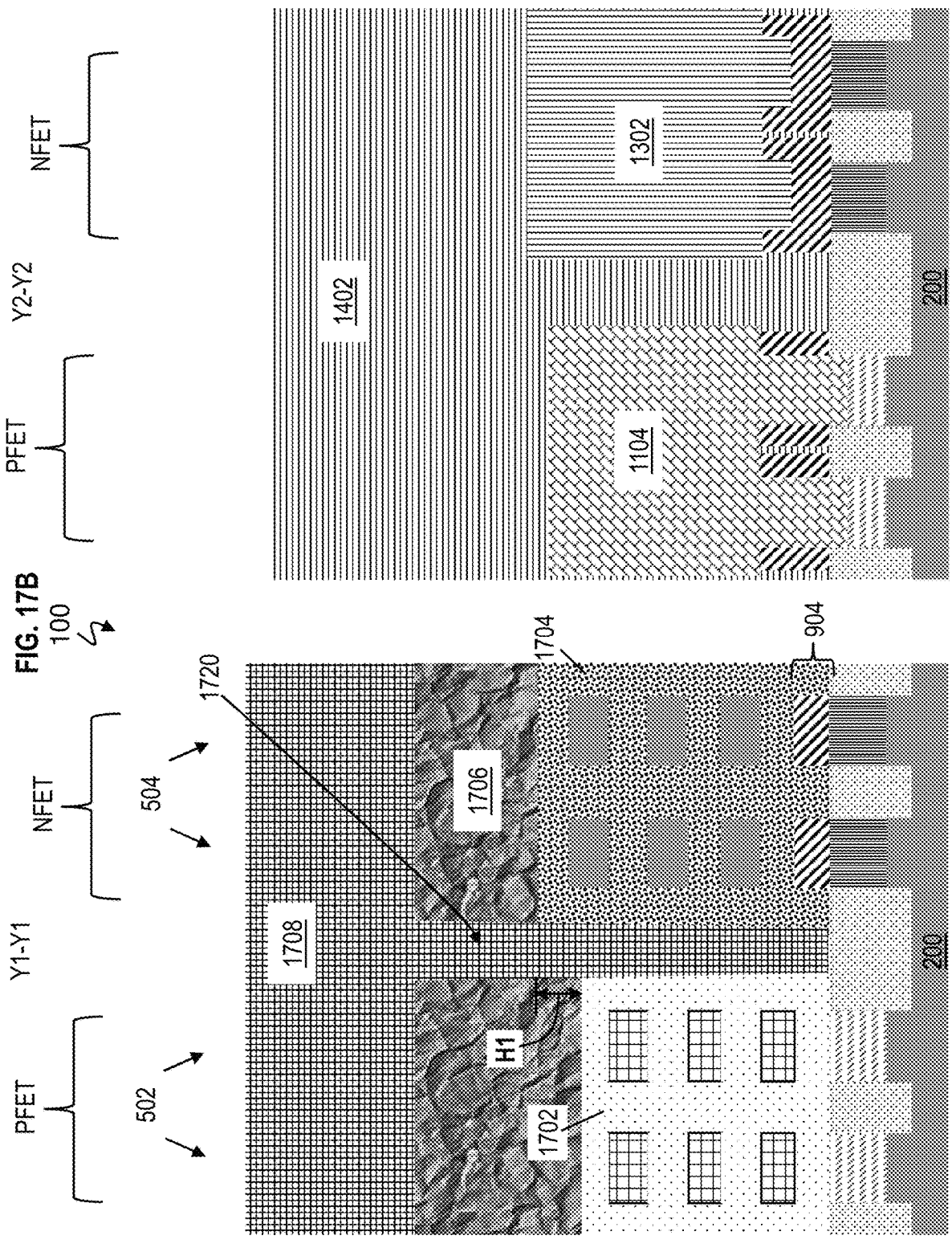

FIGS. 17A and 17B depict cross-sectional views of a portion of the IC 100 after fabrication operations according to one or more embodiments of the invention. FIGS. 17A and 17B further completes the replacement metal gate process, which could be performed using various techniques. A high-k dielectric layer is deposited in both the PFET and NFET regions. A P-type work function material/metal is deposited in both the PFET and NFET regions. The P-type work function material is removed from the NFET regions, leaving a high-k and P-type WFM stack 1702 in the PFET region and only the high-k dielectric material in the NFET regions. While protecting the PFET region (e.g., using a mask), an N-type work function material/metal is deposited on the high-k dielectric layer in the NFET region, resulting in a high-k and N-type WFM stack 1704 in the NFET region. As seen in FIG. 17B, the high-k and N-type WFM stack 1704 in the NFET region is taller or has a greater height in the vertical direction (e.g., along the z-axis) than the high-k and P-type WFM stack 1702. The difference in height is denoted by a value of H1 in the z-axis.

Techniques for forming high-k metal gate (HKMG) in gate openings are well-known in the art and, thus, the details have been omitted in order to allow the reader to focus on the salient aspects of the disclosed methods. However, it should be understood that such HKMG will generally include formation of one or more gate dielectric layers (e.g., a high-k gate dielectric layer), which are deposited so as to line the gate openings, and formation of one or more metal layers, which are deposited onto the gate dielectric layer(s) so as to fill the gate openings. The materials and thicknesses of the dielectric and metal layers used for the HKMG can be preselected to achieve desired work functions given the conductivity type of the FET. To avoid clutter in the drawings and to allow the reader to focus on the salient aspects of the disclosed methods, the different layers within the HKMG stack are not illustrated. For explanation purposes, a high-k gate dielectric layer can be, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal.

A metal material 1706 is deposited in both the PFET and NFET regions and is recessed, using, for example, chemical mechanical polishing/planarization. The metal material 1706 may be a fill metal. Etching may be performed to further recess the metal material 1706. The metal material 1706 may be tungsten. Lithography may be utilized to perform a gate cut 1720 through the metal material 1706, the high-k and P-type WFM stack 1702, and the high-k and N-type WFM stack 1704. This gate cut 1720 leaves an opening between the PFET region and the NFET region, which is filled by insulation material as best seen in FIG.

17B, thereby forming self-aligned contact (SAC) caps 1708. The insulation material of the SAC caps 1708 may include SiN, SiNC, SiBCN, etc.

Figure 18A:
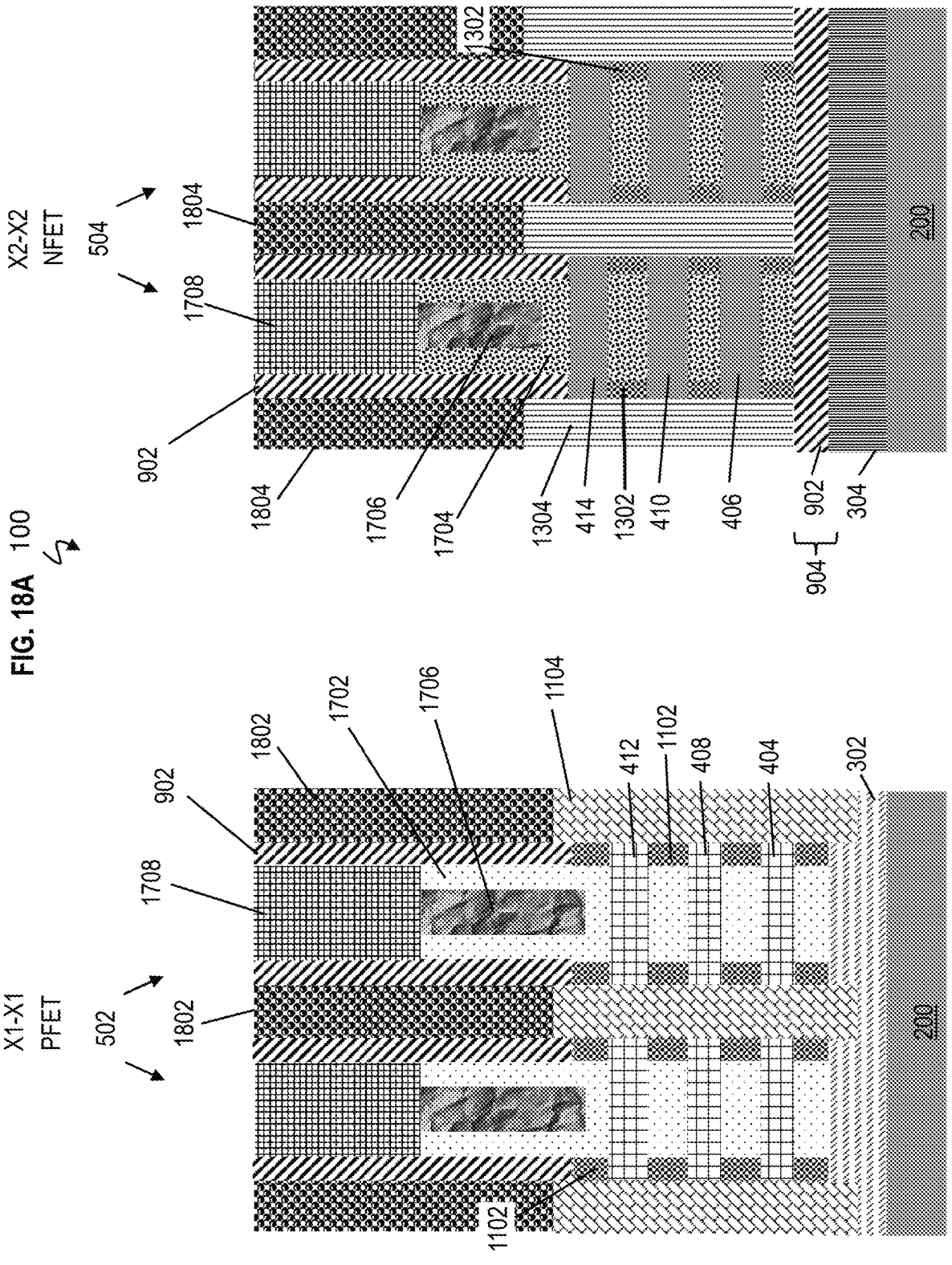
FIGS. 18A and 18B depict cross-sectional views of a portion of an IC under-fabrication after fabrication operations according to one or more embodiments of the invention.
Figure 18B:
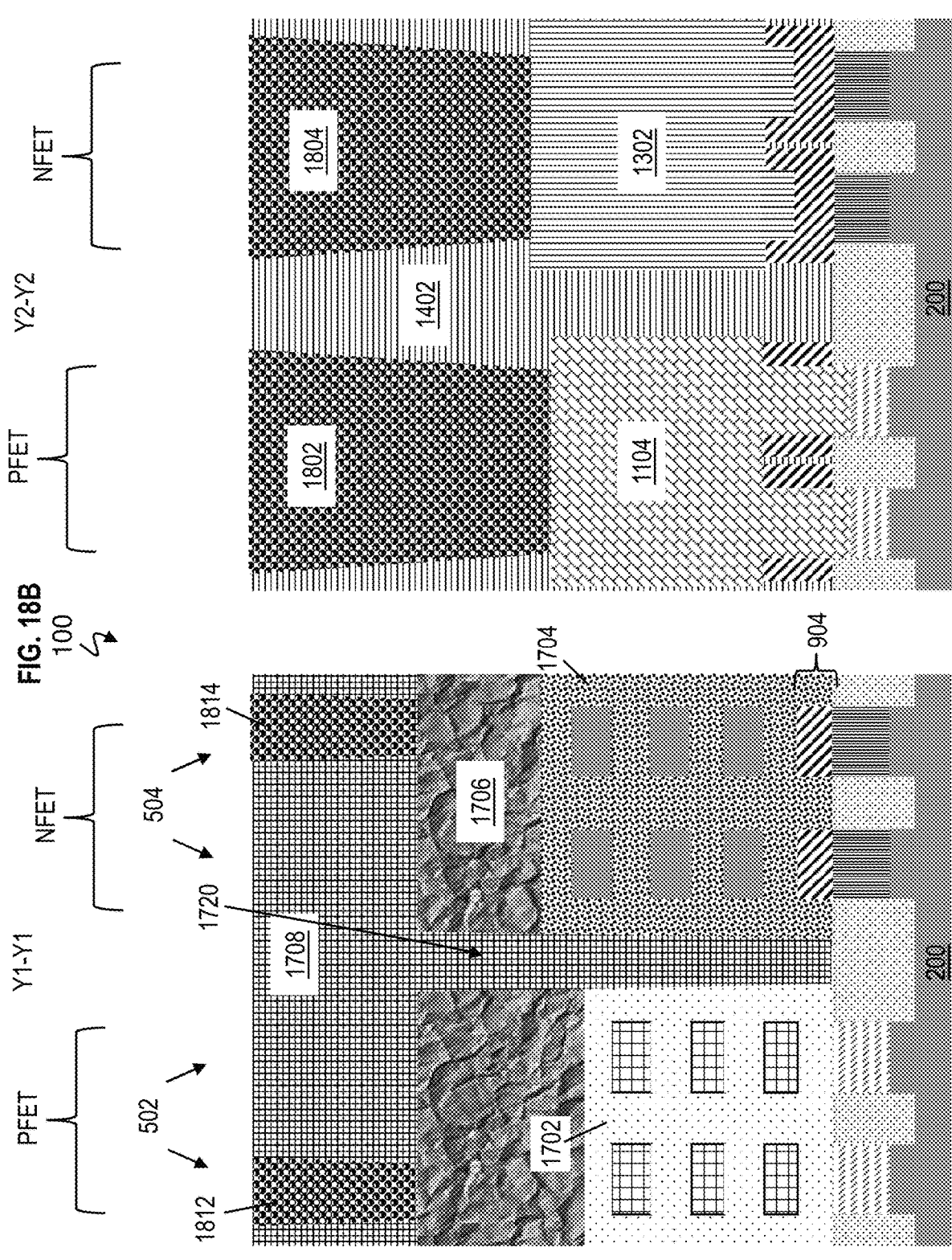

FIGS. 18A and 18B depict cross-sectional views of a portion of the IC 100 after fabrication operations according to one or more embodiments of the invention. Standard lithographic processes may be utilized to form source/drain trenches in the ILD layer 1402 and gate trenches in the SAC cap 1708. Conductive material is deposited to form PFET source/drain trench contacts 1802 over the PFET source/drain regions 1104 as well as NFET source/drain trench contacts 1804 over the NFET source/drain regions 1304. Also, the conductive material forms PFET gate contact 1812 and NFET gate contact 1814. The conductive material includes a metal and may, in some cases, include a silicide. The filled gate cut 1720 forms independently controlled gates for the PFET transistors in the PFET region and NFET transistors in the NFET region.

Figure 19A:
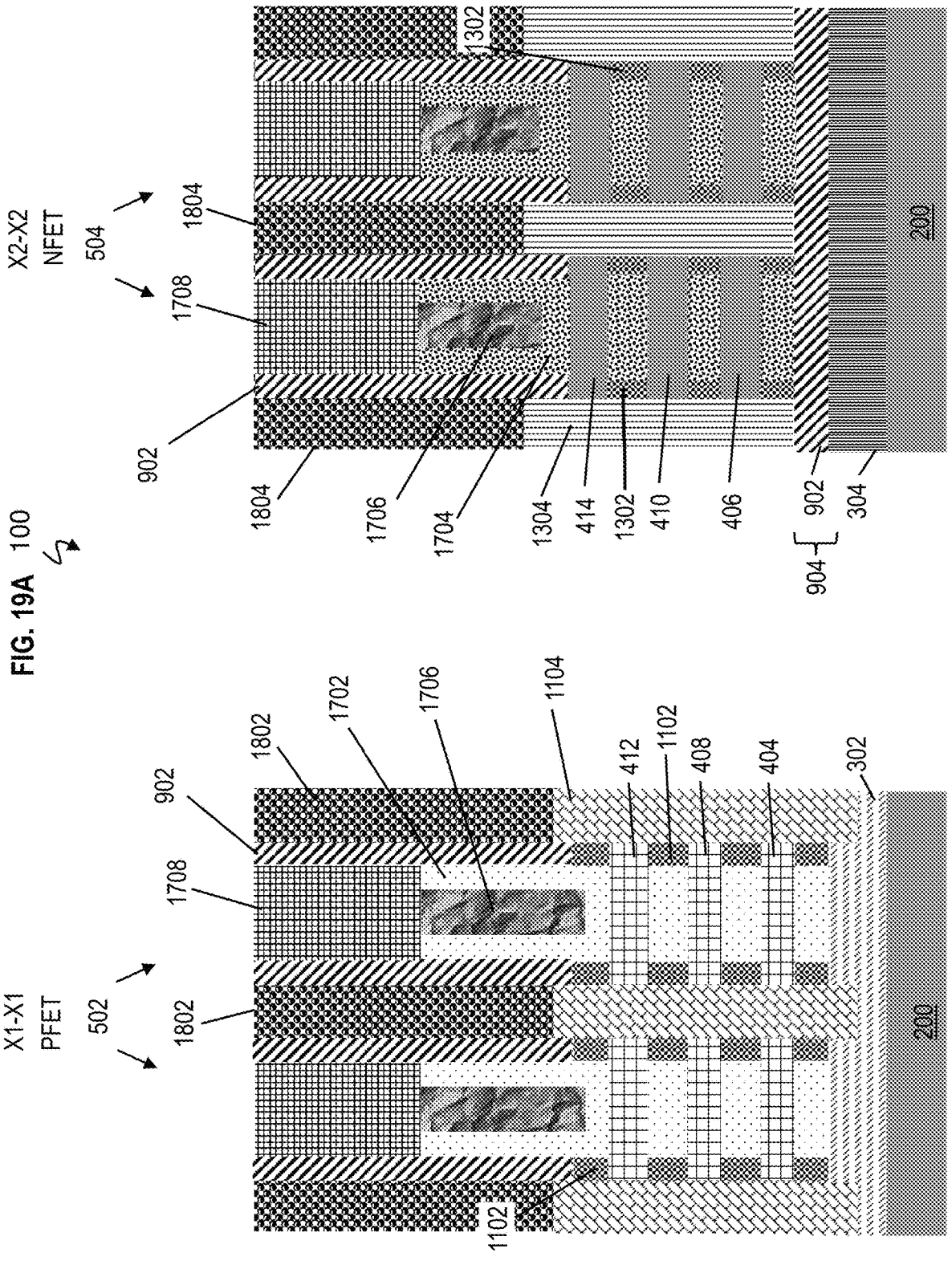
FIGS. 19A and 19B depict cross-sectional views of a portion of an IC under-fabrication after fabrication operations according to one or more embodiments of the invention.
Figure 19B:
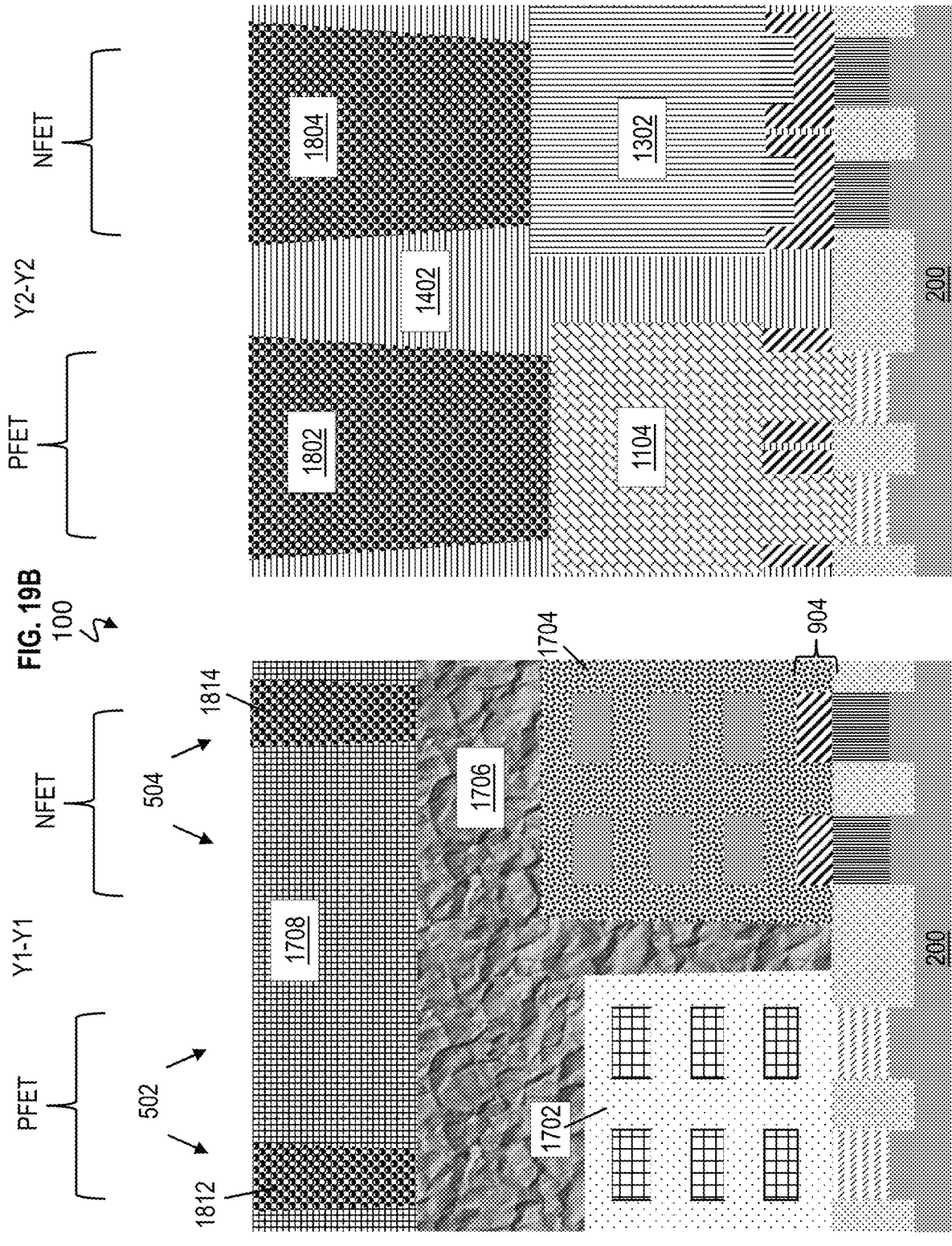

FIGS. 19A and 19B depict cross-sectional views of a portion of the IC 100 after fabrication operations according to one or more embodiments of the invention. FIGS. 19A and 19B are analogous to FIGS. 18A and 18B except for the gate cut. In FIGS. 19A and 19B, the PFET transistors and NFET transistors have shared gates, because the metal material 1706 is in direct contact with both the high-k and P-type WFM stack 1702, and the high-k and N-type WFM stack 1704.

FIG. 20 is a flowchart of a computer-implemented method 200 of forming a single stack dual channel gate-all-around nanosheet with a strained PFET and a bottom dielectric isolation NFET according to one or more embodiments. Reference can be made to any of the figures discussed herein. At block 2002, the method 2000 includes forming a PFET (e.g., depicted in FIGS. 18A, 18B, 19A, 19B) comprising at least one silicon germanium channel (e.g., one or more semiconductor layers 404, 408, 412). At block 2004, the method 2000 includes forming an NFET (e.g., depicted in FIGS. 18A, 18B, 19A, 19B) comprising at least one silicon channel (e.g., one or more semiconductor layers 406, 410, 414), the PFET being positioned laterally to the NFET, the at least one silicon channel and the at least one silicon germanium channel being staggered in a vertical direction (e.g., at different heights in the z-axis). The PFET and NFET are adjacent to one another on the same substrate 200.

The NFET comprises a bottom isolation layer 904, the PFET being free of any bottom isolation layer. The PFET comprises a p-type gate stack (e.g., high-k and P-type WFM stack 1702), a portion of the p-type gate stack extending vertically below a top surface of an electrically insulating bottom isolation layer 904.

The PFET comprises a plurality of silicon germanium channels (e.g., one or more semiconductor layers 404, 408, 412) one of which is the at least one silicon germanium channel, the NFET comprising a plurality of silicon channels (e.g., one or more semiconductor layers 406, 410, 414) one of which is the at least one silicon channel; the plurality of silicon germanium channels and the plurality of silicon channels are staggered in the vertical direction.

Inner spacers 1102 of the PFET are staggered in the vertical direction from inner spacers 1302 of the NFET. A center axis or central axis of epitaxial material of a source and a drain (e.g., source and drain regions 1104) of the PFET is below a center axis of epitaxial material of a source and a drain (e.g., source and drain regions 1304) of the NFET. A center axis or central axis of the at least one silicon channel (e.g., any one or more semiconductor layers 406, 410, 414) is offset in a vertical direction from a center axis of the at least one silicon germanium channel (e.g., any one or more semiconductor layers 404, 408, 412), when compared on a one-to-one basis.

A bottom isolation layer 904 in the NFET causes a center axis of the at least one silicon channel to be offset in a vertical direction from a center axis of the at least one silicon germanium channel. The PFET comprises a first punch-through-stopper implant layer (e.g., PTS layer 302) and the NFET comprises a second punch-through-stopper implant layer (e.g., PTS layer 304), at least one portion of the first punch-through-stopper implant layer (e.g., PTS layer 302) being recessed. Epitaxial material of a source and a drain (e.g., source/drain regions 1104) in the PFET comprises a composite material (e.g., Si:B with SiGe:B on top). The epitaxial material of the source and the drain in the PFET is in contact with a punch-through-stopper implant layer (e.g., PTS layer 302). A crystal lattice of the at least one silicon germanium channel comprises compressive strain generated by a compressive force from the epitaxial material of the source and the drain (e.g., source and drain regions 1104) in the PFET. A top surface of a work function material stack (e.g., high-k and N-type WFM stack 1704) for the NFET is above a top surface of a work function material stack (e.g., high-k and P-type WFM stack 1702) for the PFET.

FIG. 21 is a flowchart of a computer-implemented method 2100 of forming a single stack dual channel gate-all-around nanosheet with a strained PFET and a bottom dielectric isolation NFET according to one or more embodiments. Reference can be made to any of the figures discussed herein. At block 2102, the method 2100 includes forming a single stack (e.g., nanosheet stack 400) into a first nanosheet stack (e.g., PFET fins 502) and a second nanosheet stack (e.g., NFET fins 504), each of the first and second nanosheet stacks comprising a first layer (e.g., semiconductor layer 402), second layers (e.g., semiconductor layers 404, 408, 412), and third layers (e.g., semiconductor layers 406, 410, 414). At block 2104, the method 2100 includes replacing the first layer in the second nanosheet stack with an electrically insulating bottom isolation layer 904. At block 2106, the method 2100 includes replacing the first layer and the third layers in the first nanosheet stack with first gate stack material (e.g., high-k and P-type WFM stack 1702). At block 2108, the method 2100 includes replacing the second layers in the second nanosheet stack with second gate stack material (e.g., high-k and N-type WFM stack 1704).

Replacing the first layer and the third layers in the first nanosheet stack with the first gate stack material comprises: selectively etching the first layer; and selectively etching the third layers, while preventing the second layers from being etched in the first nanosheet stack. Replacing the second layers in the second nanosheet stack with the second gate stack material comprises: selectively etching the second layers while preventing the third layers from being etched.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A device comprising:
   a p-type field-effect transistor (PFET) comprising at least one silicon germanium channel and a first punch-through-stopper-implant layer; and
   an n-type field-effect transistor (NFET) comprising at least one silicon channel, a second punch-through-stopper implant layer, and an electrically insulating bottom isolation layer disposed between the at least one silicon channel and the second punch-through-stopper implant layer, the PFET being positioned laterally to the NFET, the at least one silicon channel and the at least one silicon germanium channel being staggered in a vertical direction;
   wherein the first punch-through-stopper-implant layer facilitates compressive strain to the at least one silicon germanium channel;
   wherein a first top surface of the first punch-through-stopper-implant layer is coplanar with a second top surface of the second punch-through-stopper implant layer.

2. The device of claim 1, wherein the PFET is free of the electrically bottom isolation layer.

3. The device of claim 1, wherein the PFET comprises a p-type gate stack, a portion of the p-type gate stack extending vertically below a top surface of an electrically insulating bottom isolation layer.

4. The device of claim 1, wherein:
   the PFET comprises a plurality of silicon germanium channels one of which is the at least one silicon germanium channel, the NFET comprising a plurality of silicon channels one of which is the at least one silicon channel; and
   the plurality of silicon germanium channels and the plurality of silicon channels are staggered in the vertical direction.

5. The device of claim 1, wherein inner spacers of the PFET are staggered in the vertical direction from inner spacers of the NFET.

6. The device of claim 1, wherein a center axis of epitaxial material of a source and a drain of the PFET is below a center axis of epitaxial material of a source and a drain of the NFET.

7. The device of claim 1, wherein a center axis of the at least one silicon channel is offset in the vertical direction from a center axis of the at least one silicon germanium channel.

8. The device of claim 1, wherein an electrically insulating bottom isolation layer in the NFET causes a center axis of the at least one silicon channel to be offset in the vertical direction from a center axis of the at least one silicon germanium channel.

9. The device of claim 1, wherein at least one portion of the first punch-through-stopper-implant layer is recessed.

10. The device of claim 1, wherein:

epitaxial material of a source and a drain in the PFET and the NFET comprises a composite material;

the epitaxial material of the source and the drain in the PFET is in contact with the first punch-through-stopper implant layer; and a crystal lattice of the at least one silicon germanium channel comprises the compressive strain generated by a compressive force from the epitaxial material of the source and the drain in the PFET.

11. The device of claim 1, wherein a top surface of a work function material stack for the NFET is above a top surface of a work function material stack for the PFET.

12. A method comprising:

forming a PFET comprising at least one silicon germanium channel and a first punch-through-stopper-implant layer; and forming an NFET comprising at least one silicon channel, a second punch-through-stopper implant layer, and an electrically insulating bottom isolation layer disposed between the at least one silicon channel and the second punch-through-stopper implant layer, the PFET being positioned laterally to the NFET, the at least one silicon channel and the at least one silicon germanium channel being staggered in a vertical direction;

wherein the first punch-through-stopper-implant layer facilitates compressive strain to the at least one silicon germanium channel;

wherein a first top surface of the first punch-through-stopper-implant layer is coplanar with a second top surface of the second punch-through-stopper implant layer.

13. The method of claim 12, wherein the PFET is free of the electrically bottom isolation layer.

14. The method of claim 12, wherein the PFET comprises a p-type gate stack, a portion of the p-type gate stack extending vertically below a top surface of an electrically insulating bottom isolation layer.

15. The method of claim 12, wherein:

the PFET comprises a plurality of silicon germanium channels one of which is the at least one silicon germanium channel, the NFET comprising a plurality of silicon channels one of which is the at least one silicon channel; and the plurality of silicon germanium channels and the plurality of silicon channels are staggered in the vertical direction.

16. The method of claim 12, wherein inner spacers of the PFET are staggered in the vertical direction from inner spacers of the NFET.

17. The method of claim 12, wherein a center axis of epitaxial material of a source and a drain of the PFET is below a center axis of epitaxial material of a source and a drain of the NFET.

* * * * *